(12) United States Patent
Ayai

(10) Patent No.: US 7,162,287 B2
(45) Date of Patent: Jan. 9, 2007

(54) OXIDE HIGH-TEMPERATURE SUPERCONDUCTING WIRE AND METHOD OF PRODUCING THE SAME

(75) Inventor: Naoki Ayai, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/749,574

(22) Filed: Dec. 31, 2003

(65) Prior Publication Data

US 2004/0157746 A1    Aug. 12, 2004

Related U.S. Application Data

(62) Division of application No. 09/938,829, filed on Aug. 27, 2001, now abandoned.

(30) Foreign Application Priority Data

Aug. 29, 2000  (JP) .............................. 2000-258753

(51) Int. Cl.
  *H01B 12/00*  (2006.01)
  *H01F 6/00*  (2006.01)
  *H01L 39/00*  (2006.01)
  *H01L 39/24*  (2006.01)

(52) U.S. Cl. .................... 505/231; 505/237; 505/238; 505/431; 428/699; 428/701

(58) Field of Classification Search .................. None
  See application file for complete search history.

(56) References Cited

U.S. PATENT DOCUMENTS

| | | | |
|---|---|---|---|
| 4,336,420 A | 6/1982 | Benz | |
| 4,929,596 A | 5/1990 | Meyer et al. | |
| 4,954,479 A | 9/1990 | Dubots et al. | |
| 4,965,249 A * | 10/1990 | De With et al. | 505/430 |
| 5,004,722 A | 4/1991 | Tallman | |
| 5,017,553 A | 5/1991 | Whitlow et al. | |
| 5,079,218 A | 1/1992 | Tanaka et al. | |
| 5,283,232 A | 2/1994 | Kohno et al. | |
| 5,364,709 A | 11/1994 | Yu | |
| 5,424,282 A * | 6/1995 | Yamamoto et al. | 505/433 |
| 5,639,714 A | 6/1997 | Hikata et al. | |
| 5,849,670 A | 12/1998 | Nabatame et al. | |
| 5,908,812 A | 6/1999 | Cotton et al. | |
| 5,981,444 A | 11/1999 | Sawada et al. | |
| 6,110,873 A | 8/2000 | Duperray et al. | |
| 6,247,225 B1 | 6/2001 | Snitchler et al. | |
| 6,276,048 B1 | 8/2001 | Hikata et al. | |

(Continued)

FOREIGN PATENT DOCUMENTS

EP    63239741    5/1988

(Continued)

OTHER PUBLICATIONS

Translation of WO 96/28853 A1, pp. 1-41 and cover sheet.*

*Primary Examiner*—Colleen P. Cooke
(74) *Attorney, Agent, or Firm*—Foley & Lardner LLP

(57) ABSTRACT

This invention relates to an oxide superconducting wire comprising oxide superconducting filaments, a high-density ceramic layer uniformly surrounding each of the filaments, and a silver sheath that directly covers the ceramic layer. The ceramic layer becomes non-superconducting when the filaments are cooled to an operating temperature of oxide superconductors. The oxide superconductors can be isolated by the ceramic that acts as a highly resistive material or an insulator. A high normal resistance is achieved, and thereby AC loss is reduced remarkably.

19 Claims, 17 Drawing Sheets

U.S. PATENT DOCUMENTS

| | | |
|---|---|---|
| 6,311,385 B1 | 11/2001 | Ueyama et al. |
| 6,311,835 B1 | 11/2001 | Okuhara et al. |
| 6,344,287 B1 | 2/2002 | Celik et al. |
| 6,344,430 B1 | 2/2002 | Duperray et al. |
| 6,357,105 B1 | 3/2002 | Hikata et al. |
| 6,397,454 B1 * | 6/2002 | Seuntjens et al. ............. 29/599 |
| 6,418,331 B1 | 9/2002 | Goldacker |

FOREIGN PATENT DOCUMENTS

| | | |
|---|---|---|
| EP | 0310182 A1 | 4/1989 |
| EP | 0509436 A2 | 10/1992 |
| EP | 06076650 | 3/1994 |
| EP | 0977281 A1 | 7/1999 |
| JP | 63239741 | 5/1988 |
| JP | 63239741 | 10/1988 |
| JP | 01-095409 A | 4/1989 |
| JP | 01140520 | 6/1989 |
| JP | 03015115 | 1/1991 |
| JP | 03015116 | 1/1991 |
| JP | 03138820 | 6/1991 |
| JP | 05-114313 A | 5/1993 |
| JP | 06076650 | 3/1994 |
| JP | 10050152 | 2/1998 |
| JP | 10247428 | 9/1998 |
| JP | 11007846 | 1/1999 |
| JP | 11312420 | 11/1999 |
| WO | WO 96/28853 | 9/1996 |
| WO | WO 96/28853 A1 | 9/1996 |
| WO | WO 99/45597 A1 | 2/1999 |

* cited by examiner 21 22
23

21 22 24
23
25

41a 41

42

100 110 112
113

100 110 112
113 114
115

100 110 112 114
116

100 110 212
113    114
    115

100 110 212 114
     116

OXIDE HIGH-TEMPERATURE SUPERCONDUCTING WIRE AND METHOD OF PRODUCING THE SAME

CROSS-REFERENCE TO RELATED PATENT APPLICATIONS

This application is a division of application Ser. No. 09/938,829, filed Aug. 27, 2001, now abandoned, and based on Japanese Patent Application No. 2000-258753, filed Aug. 29, 2000, by Naoki AYAI This application claims only subject matter disclosed in the parent application and therefore presents no new matter.

BACKGROUND OF THE INVENTION

1. Field of the Invention

The present invention relates to an oxide superconducting wire and method of producing the same. More particularly, the invention relates to oxide superconducting wires and methods of producing the same that are intended for applications in such fields as electric power supply, transportation, high-energy physics, and medical instruments.

2. Description of the Background Art

In recent years, it has been reported that sintered oxide materials exhibit superconducting property at high critical temperatures, and practical applications of superconduction technology are being promoted by utilizing such superconductors. It has also been reported that an yttrium-based oxide brings about superconducting property at the temperature of 90 K and a bismuth-based oxide at the temperature of 110 K. These oxide superconductors are hopefully expected to serve practical use, because they exhibit superconducting property in liquid nitrogen, which can be available at relatively low cost.

In order to use such a superconductor to carry AC current for electric power supply, for example, the superconductor is formed into a superconducting wire or strand, in which it is covered with a silver sheath that is coated with a high-resistance material having a metal coating thereon.

Superconducting wires having such structures as described above are disclosed in International Publication No. WO96-28853, and Japanese Patent Application Laid-open Gazette Nos. 11-7846 (Patent Gazette No. 2992502), 10-50152, 10-247428, 3-15116, 11-312420, 3-15115, and 1-140520 (Patent Gazette No. 2877149).

International Publication No. WO96-28853 discloses a structure of an oxide superconducting wire, wherein each of the oxide superconductors is individually surrounded by, for example, a silver sheath that is surrounded by a metal casing, which is oxidized to form a high-resistance layer between the silver and the casing.

Japanese Patent Application Laid-open Gazette No. 11-7846 discloses a structure of an oxide high-temperature superconducting wire comprising superconducting ceramic filaments each of which is surrounded by a first layer of silver alloy that is covered with an oxygen-permeable non-superconducting ceramic layer that is surrounded by a second layer of silver alloy.

Japanese Patent Application Laid-open Gazette No. 10-50152 discloses a structure of an oxide superconducting wire comprising oxide superconducting filaments each of which is surrounded by a silver sheath that is covered with a resistive alloy (a high-resistance material) that is oxidized to form an insulating oxide between the silver sheath and the high resistive alloy.

Japanese Patent Application Laid-open Gazette No. 10-247428 discloses a structure of a multifilament oxide superconducting wire comprising a plurality of oxide superconducting strands that are individually covered with metal layers in which the resistivity of the outer metal layer is higher than that of the inner metal layer.

Japanese Patent Application Laid-open Gazette No. 3-15116 discloses an oxide superconducting wire having anisotropy. The wire comprises a core and a superconducting layer thereon. The superconducting layer surrounds the core in such a configuration that a specific crystallographic axis of the layer is oriented toward the core. The superconducting layer is divided into a plurality of segments and provided in configurations elongated in the circumferential direction as compared with the radial directions. This publication also discloses another oxide superconducting wire, wherein a high-resistance layer consisting of a resistive material is placed between a plurality of superconducting layers.

Japanese Patent Application Laid-open Gazette No. 11-312420 discloses an oxide superconducting wire comprising a plurality of oxide superconductors, each surrounded by a silver-based sheath that is surrounded by a high-resistance layer formed of a material including a heat-resistant ceramic, and further comprising an overall coating made of a material inert to the material of the high-resistance layer in a hot oxidizing atmosphere.

Japanese Patent Application Laid-open Gazette No. 3-15115 discloses a metal-coated oxide superconducting wire in which an oxidation-resistant metal is used as a cladding.

Japanese Patent Application Laid-open Gazette No. 1-140520 discloses a technology for subjecting a metal pipe, which is filled with a ceramic powder, first to plastic deformation to reduce its cross sectional area and thereafter to a heat treatment. This application also discloses a method of subjecting a metal pipe to hot plastic deformation so as to produce a small-diameter oxide superconducting wire having sufficient strength and toughness as well as high critical current density and high critical temperature.

The aforementioned oxide superconducting wires, however, have the following disadvantages.

A multifilament oxide superconducting wire incorporating silver sheaths is disadvantageous in that AC loss cannot be reduced sufficiently because silver as a sheath has low resistance. In the techniques disclosed in the aforementioned publications, superconducting filaments (covered by silver) are enclosed by barriers consisted of such as metal oxide having the insulating or resistive property for the purpose of the reduction of AC loss. However, it is difficult to make such barriers with a uniform density and thickness in limited spaces between the filaments. This subsequently makes it difficult to increase perpendicular resistance between the filaments to such a desirable level as to reduce AC loss. Furthermore, making the barrier layers thicker to realize sufficient resistance may, in turn, lead to decreasing the ratio of the superconducting filaments contained in the total oxide superconducting wire and subsequently making current density lower.

Conventionally, barriers of a high-resistance material consisting of, for example, a metal oxide are formed by coating a slurry containing a metal oxide on the outer surface of the silver sheath covering the filaments. Upon coating the slurry, the barrier layers tended to have such a low density that they were prone to irregular deformation and were not formed uniformly.

Furthermore, Japanese Patent Application Laid-open Gazette No. 63-239741 discloses a method of producing a superconducting wire. In the method, a slurry of an oxide-based superconductor and a slurry of a non-superconducting inorganic material are disposed such that the former is surrounded by the latter, and they are extruded through a die by either pressing or taking advantage of the weight of the slurries to produce a composite wire. After the composite wire is heated for drying and reduced its cross-section, the composite wire is covered with a metal tape, while being twisted at the same time.

The superconducting wire produced by the aforementioned method, however, can be neither drawn nor rolled any more, as it is covered with a metal tape. This prevents the crystallic axis of the oxide superconductors from being oriented uniformly, lowers critical current, and consequently makes it difficult to apply the superconducting wire to a practical use.

Further the conventional oxide superconductors were not capable of effectively releasing oxygen and other gases outside that were generated during a reaction process, as the superconductors were coated with silver sheaths. Consequently, as the reaction progressed to some extent, the internal pressure in the filaments increased to cause the crystal grains to be pushed apart, thereby creating interstices within the filaments. Japanese Patent Application Laid-open Gazette No.3-138820 discloses a method of producing an oxide superconductor that has a high critical current density. According to the method, the precursor of oxide superconductor is subjected to a second-stage plastic deformation to eliminate such interstices and increase its density, and then to a second-stage heat treatment. It is impossible, however, to completely bond the plural crystal grains of the oxide superconductor together, once they are formed as a result of the reaction, even if such subsequent second-stage plastic deformation and heat treatment are conducted. In heat treatment, excessively increased temperature for bonding the crystal grains may cause the once-formed oxide superconductor to melt and break up into different phases including a non-superconducting phase. A cross-section reduction ratio of plastic deformation and compressive stress applied to the oxide superconductor, if increased excessively, may create cracks of the crystal grains in the oxide superconductors and increase a portion where the bonding between the grains is not sufficient.

As described so far, the conventional methods may lower the critical current density of an oxide superconductor depending on the conditions. Even if such conditions are carefully selected to realize the highest critical current density based on the conventional methods, filaments contained in an oxide superconducting wire are aggregation of crystal grains as small as several μm, in which non-superconducting phases remain dispersed. Some crystal grains in a superconducting phase are so weakly bonded that they may show resistance in small magnetic fields and electric currents, thus lowering the critical current density.

Conventional oxide superconducting wires employed metal pipes, especially expensive silver pipes, considering their effective affinity with the oxide superconductors. For the production of multifilament superconducting wires based on conventional methods, a prolonged process is required, including steps of manufacturing both monofilament and multifilament wires. For the aforementioned reasons, overall production cost has soared and become a major impediment to wider applications of an oxide superconducting wire as an industrial product.

SUMMARY OF THE INVENTION

It is an object of the present invention, by solving the aforementioned problems to provide an improved oxide superconducting wire capable of reducing AC loss, together with a method of producing the same.

An oxide superconducting wire produced according to the present invention has a structure in which each of oxide superconductors is in contact and coated with a ceramic layer, and the ceramic layer is in contact and covered with a metal sheath. The ceramic layer becomes non-superconductive at the operating temperature of the oxide superconductors.

The foregoing structure allows the oxide superconductors contained therein to be in contact with the ceramic layer. The ceramic layer functions as either a high-resistant barrier or an insulator that isolates the superconductors, making it possible to achieve a high perpendicular resistance therein. This results in a remarkable reduction of AC loss. Furthermore, the oxide superconductor can exhibit a high critical current density (Je) because it has the same volumetric ratio as in a conventional oxide superconducting wire having a silver sheath.

The present invention facilitates the release of oxygen and other gases generated during a reaction of the production process because a ceramic enclosing the oxide superconductors is permeable to air to some extent. This enables the superconductive filaments contained therein to achieve a high density and allow crystal grains constituting the filaments to be bonded so strongly that a high critical current density can be realized.

Moreover, this invention helps reduce the quantity of silver to be used, as the oxide superconductors are closely covered with ceramic layers. And as a result, the reduction of silver usage may also curtail overall production cost extremely.

The ceramic layer interposed between the oxide superconductors and the metal sheath is also useful to prevent the two from causing atomic diffusion. Therefore, the ceramic layer permits the realization of a high critical current density as well as a wider selection of metals to be used for the metal sheath.

It is preferable that the oxide superconductors are divided into plural segments, as this can make AC loss even smaller.

Preferably, the oxide superconductors are formed spirally toward the central axis of the oxide superconducting wire. In this case, further reduction of AC loss can be achieved.

Preferably, the ceramic layer consists of an oxide containing at least one kind selected from the group consisting of bismuth, lead, strontium, calcium, barium, titanium, niobium, molybdenum, tantalum, tungsten, vanadium, zirconium, copper, and silver. The oxide superconductor includes a bismuth-based superconductor. Bismuth-based oxide superconductors are useful for elevating a critical temperature of the superconductors and making the ceramic layer thereon easy to process. And the filaments, although being directly in contact with the ceramic layer, can be transformed to the oxide superconductors. This enables to form stable ceramic layer that is directly in contact with the oxide superconductors.

Preferably, the ceramic layer contains an oxide including an alkali earth metal and copper. Such ceramic layer and the oxide superconductors thereunder have almost the same crystal structures, and this combination ensures excellent workability and a uniform sectional structure. As a result, it becomes possible to obtain a superconducting wire whose critical current density is higher and AC loss is smaller.

Preferably, the metal pipes include at least one kind of metal selected from the group consisting of silver, copper, manganese, magnesium, antimony, iron, chromium, and nickel. As these metals are chemically stable, they react neither with the ceramic layer nor with the oxide superconductors, allowing the superconductors to surely demonstrate superconductivity. Furthermore, the use of manganese, magnesium, antimony, iron, chromium, and nickel can improve the mechanical strength of the oxide superconductors.

An oxide superconducting wire according to another embodiment of the present invention has a structure in which oxide superconductors are individually surrounded by a ceramic layer produced by an extrusion method, and the ceramic layer, which becomes non-conductive at the operating temperature of the superconductors, is covered with a metal sheath. Extrusion can produce a ceramic layer of high density including no blowholes, and subsequently, AC loss can be reduced. The ceramic layer is inserted into the metal pipe that enables subsequent drawing and rolling. This also makes it possible to orient the direction of crystal grains contained in the oxide superconductors, so that it becomes easier to improve critical current density.

Preferably, the oxide superconducting wire employs silver-based sheaths interposed between the oxide superconductor and the ceramic layer. Such silver-based sheaths facilitate processing of the oxide superconductors therein.

Preferably, the oxide superconductors are in contact and coated with the ceramic layer.

The present invention provides methods of producing an oxide superconducting wire as follows:

Method I includes the steps of:
a) Forming precursor powders of oxide superconductor into a rod
b) Forming a ceramic powder into a layer on the surface of the rod to produce a ceramic-coated rod
c) Inserting a plurality of the ceramic-coated rods into a metal pipe to produce a multifilament billet
d) Subjecting the multifilament billet to plastic deformation to produce a multifilament wire
e) Subjecting the multifilament wire to heat treatment to produce an oxide superconductor This production method having the foregoing steps permits the formation of a ceramic layer on the surface of a rod consisting of precursor powder of oxide superconductor. Unlike conventional techniques, this production method does not form silver coatings directly on the surface of the rods, and yet helps improve the perpendicular resistance of the oxide superconductors to make AC loss smaller.

Method □
a) Forming ceramic powders into a ceramic pipe
b) Filling precursor powders of oxide superconductors in the ceramic pipe to produce a ceramic-coated rod
c) Inserting a plurality of the ceramic-coated rods into a metal pipe to produce a multifilament billet
d) Subjecting the multifilament billet to plastic deformation to produce a multifilament wire
e) Subjecting the multifilament wire to heat treatment to produce an oxide superconductor This production method having the foregoing steps permits the formation of a ceramic layer on the surface of a precursor of oxide superconductors. Unlike conventional techniques, this production method does not form silver coatings directly on the surface of the oxide superconductors, and yet helps improve the perpendicular resistance of the oxide superconductors to make AC loss smaller.

Method □
a) Forming ceramic powders into a billet which has a plurality of holes extending in a longitudinal direction
b) Filling precursor powders of oxide superconductors in the holes of the billet to produce ceramic-coated rods therein
c) Inserting a plurality of the ceramic-coated rods into a metal pipe to produce a multifilament billet
d) Subjecting the multifilament billet to plastic deformation to produce a multifilament wire
e) Subjecting the multifilament wire to heat treatment to produce an oxide superconductor This production method having the foregoing steps permits the formation of a ceramic billet providing ceramic powders on the surface of a precursor of oxide superconductors. Unlike conventional techniques, this production method does not form silver layers directly on the surface of the precursor, and yet helps improve the perpendicular resistance of the oxide superconductors and subsequently reduce AC loss.

Preferably, the precursor powders contain a part of the chemical composition of the oxide superconductors, while the ceramic powders contain the remaining part of the chemical composition of the oxide superconductors.

Method □
a) Filling a precursor powders of oxide superconductor in a silver-based sheath to produce a coated rod
b) Forming a ceramic powder layer on the surface of the coated rod by extrusion to produce a ceramic-coated rod
c) Inserting a plurality of the ceramic-coated rods into a metal pipe to produce a multifilament billet
d) Subjecting the multifilament billet to plastic deformation to produce a multifilament wire
e) Subjecting the multifilament wire to heat treatment to produce an oxide superconductor This production method having the foregoing steps does not produce blowholes in a high-resistant ceramic layer, as the layer is formed from a ceramic powder through extrusion. As a result, the layer can achieve a high density, which is effective in reducing AC loss.

Preferably, the production method includes an additional step of twisting the multifilament wire before subjecting said wire to heat treatment. This will reduce AC loss furthermore.

Further preferably, the ceramic layer, the ceramic pipe, or the ceramic billet is produced through extrusion. In this case, the extrusion effectively prevents blowholes from producing in said layers, pipes, or ceramic billets, so that each of them can become to high density. This ensures the formation of a uniform sectional structure, which can subsequently reduce AC loss.

The oxide superconducting wires produced by the aforementioned methods according to the present invention have a structure such that plural oxide superconducting filaments are inserted in a ceramic matrix that is encased in a metal sheath. As compared with the conventional techniques to produce silver-coated oxide superconducting wires by a powder-in-tube process, the production methods according to the present invention employ ceramic, instead of silver, as a coating of the filaments, which can reduce the required amount of silver roughly by 50% as compared with the conventional methods. Furthermore, the new methods simplify the manufacturing process of a monofilament wire, which can curtail overall production cost. Filaments are surrounded by ceramic matrix that is more permeable to gases than a conventionally used metal. Therefore, oxygen and other gases generated during reaction process can be diffused, and subsequently, the filaments having high density can be obtained. As a result, crystal grains contained in the oxide superconductors are so strongly bonded as to achieve a high critical current density.

Furthermore, the ceramic matrix effectively serve as barriers that prevent diffusion between the metal pipe and filaments. It is possible, therefore, to employ such materials that could not have been used for the metal pipes, without decreasing critical current density.

In contrast with the conventional structure in which a layer of a high-resistant material is formed only around the silver matrix surrounding the filaments, the present invention allows a high-resistant layer to be thicker than the conventional one. Such thicker high-resistant layer ensures the isolation of the superconducting filaments and a high perpendicular resistance, subsequently resulting in a remarkable reduction of AC loss. The oxide superconducting wire based on the present invention is capable of maintaining the same volumetric ratio of the oxide superconductor as the conventional oxide superconducting wires with silver sheaths, and so higher current density can be obtained. The ceramic matrix can be made conductive by adding a suitable carrier to the composition thereof mainly consisting of insulating material. This makes it possible to adjust the resistivity to a level that is optimal in terms of both terminal connection and AC loss.

In the manufacturing methods of the present invention, it is possible to allow an oxide superconducting wire to have a constitution such that a precursor powder of the filaments or a rod formed from the powder contains a portion of the chemical composition of oxide superconductors, while the ceramic matrix enclosing the filaments includes the remaining portion of the composition.

For example, in the case of producing $(Bi, Pb)_2 Sr_2 Ca_2 Cu_3 O_X$, the precursor powder of the filaments or the rod formed from the powder employs single-phase $(Bi, Pb)_2 Sr_2 Ca Cu_2 O_X$ superconductors, while the ceramic matrix employs a single-phase $(Ca, Sr) Cu O_2$ compound. In this case, the structure prior to heat treatment at the last stage of producing the wire is such that a plurality of $(Bi, Pb)_2 Sr_2 Ca Cu_2 O_X$ superconducting filaments are embedded in a $(Ca, Sr) Cu O_2$ matrix that is inserted in a metal pipe or sheath. Therefore, there are generated phase boundaries of $(Bi, Pb)_2 Sr_2 Ca Cu_2 O_X$ and $(Ca, Sr) Cu O_2$ on the outer circumferences of filaments.

At the early stage of heat treatment, the diffusion of these boundaries leads to the formation of $(Bi, Pb)_2 Sr_2 Ca_2 Cu_3 O_X$ At this point, cores of the filaments remain to be $(Bi, Pb)_2 Sr_2 Ca Cu_2 O_X$, around which thin phases of $(Bi, Pb)_2 Sr_2 Ca_2 Cu_3 O_X$ are formed, and the thin phases are enclosed by the matrix of $(Ca, Sr) Cu O_2$. As diffusion progresses, Ca and Cu are transferred from the matrix to the filament cores consisting of $(Bi, Pb)_2 Sr_2 Ca Cu_2 O_X$, allowing $(Bi, Pb)_2 Sr_2 Ca_2 Cu_3 O_X$ crystals to grow gradually until the entire filaments are occupied by large crystals of $(Bi, Pb)_2 Sr_2 Ca_2 Cu_3 O_X$.

In conventional methods, wherein a raw material powder, which is adjusted and preliminarily sintered to the finalized composition of $(Bi, Pb)_2 Sr_2 Ca_2 Cu_3 O_X$, is used as a precursor of the filaments, a filament contains a number of different phases of non-superconductivity as well as numerous cores of superconducting phase. As described heretofore, according to progress in diffusion the ratio of $(Bi, Pb)_2 Sr_2 Ca_2 Cu_3 O_X$ contained in the filaments increases while the different phases of non-superconductivity decrease. However, such different phases are not completely eliminated and there still remain some weakly bonded crystals of $(Bi, Pb)_2 Sr_2 Ca_2 Cu_3 O_X$.

In the method of producing an oxide superconducting wire based on the present invention, a ceramic layer, a ceramic pipe or a ceramic billet can be formed through extrusion, which enables these ceramic bodies to obtain uniform density and thickness. This method also allows the formation of high-density ceramic bodies using a small amount of binder. Even after thermal decomposition occurs in the binders, the ceramic layer finds only a slight decrease in its density. It is possible, therefore, to prevent the occurrence of irregular distortion in a cross-sectional shape at the subsequent plastic deformation process.

Ceramic-coated rods may be subjected to a specified heat treatment to complete the thermal decomposition of binders before they are bundled to form a multifilament billet. This method allows the thermal decomposition of the binder to be completed uniformly in a short time because the heat treatment can be done in a state where there are no impediments to prevent gases from flowing in and out around ceramic layers. Since the thermal decomposition of binder caused prior to plastic deformation enables a multifilament billet to have a higher filling density, it is possible to obtain a more uniform sectional structure by a subsequent plastic deformation process.

DETAILED DESCRIPTION OF THE INVENTION

Embodiment 1

Figure 1:
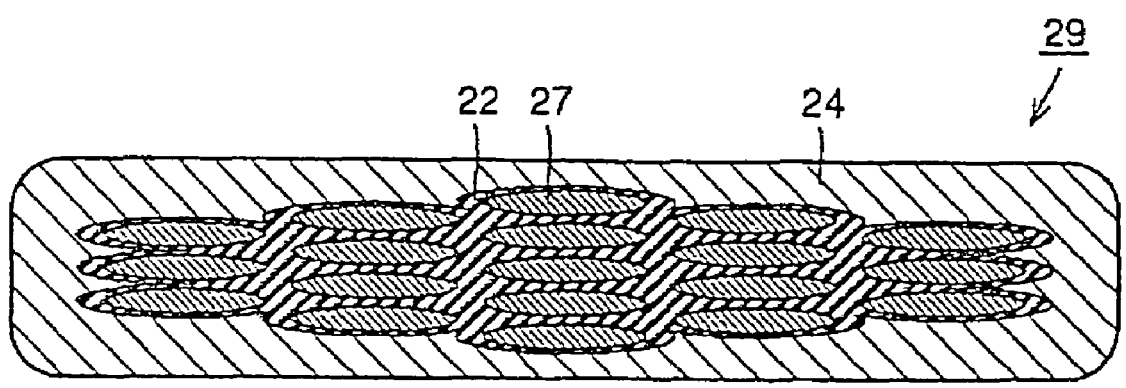
FIG. 1 is a cross-sectional view of an oxide superconducting wire produced according to a first embodiment of the present invention.

FIG. 1 shows a cross section of an oxide superconductor wire produced in accordance with the first embodiment of the present invention. The oxide superconducting wire 29 comprises oxide superconducting filaments 27, a ceramic layer 22, and a silver sheath 24 as a metal pipe. Each of the superconducting filaments 27 is in contact and coated with the ceramic layer 22. The ceramic layer 22 containing a metal oxide becomes non-conductive at an operating temperature of the filaments 27. The ceramic layer 22 is in contact and coated with the silver sheath 24. The oxide superconducting wire 29, which is formed into a tape, extends from an end whose sectional view is illustrated in FIG. 1 toward the other end not illustrated herein. The filaments 27, the ceramic layer 22, and the silver sheath 24 have flat structures elongated laterally. The filaments 27 consist of, for example, $(Bi, Pb)_2 Sr_2 Ca_2 Cu_3 O_x$. The oxide superconducting wire 29 contains a plurality of the filaments 27. The filaments 27 each enclosed by the ceramic layer 22 are arranged so as to extend spirally around the central axis of the oxide superconducting wire 29.

Figure 2:
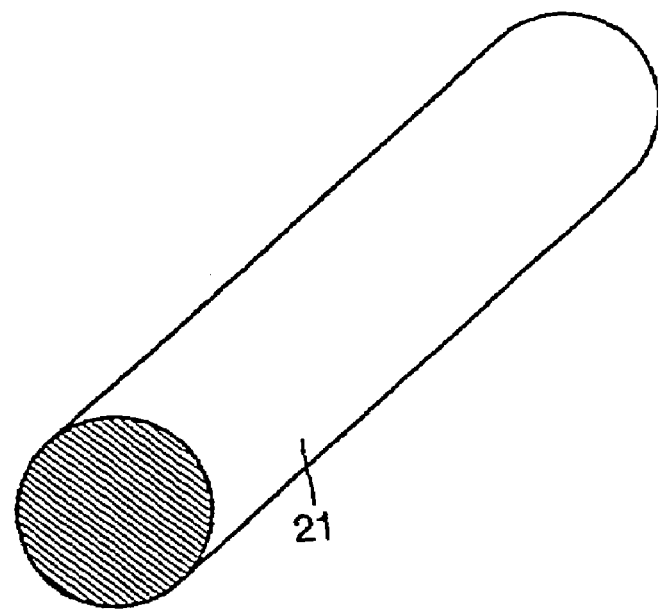
FIG. 2 is a perspective view of a rod formed from precursor powders of oxide superconductor at the first stage of manufacturing the oxide superconducting wire of FIG. 1.

Next, an explanation will be given about the manufacturing method of the oxide superconducting wire shown in FIG. 1. First, a precursor powder of the filaments is formed into a rod 21 shown in FIG. 2.

Figure 3:
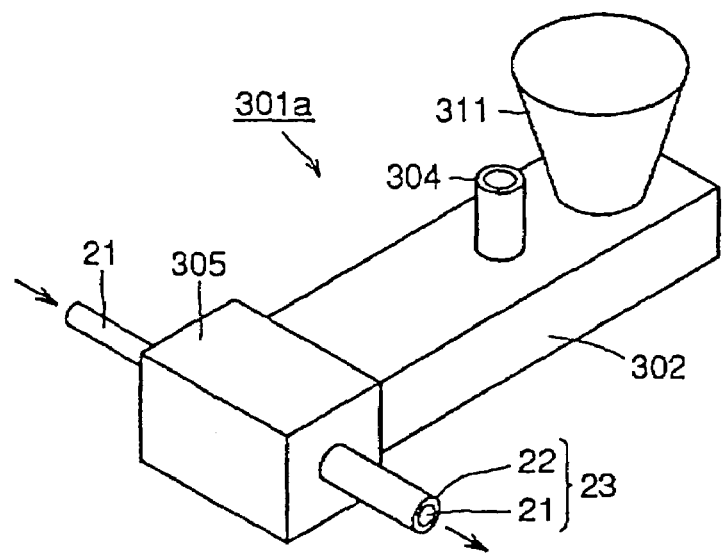
FIG. 3 is a perspective view of an equipment employed at the second stage of producing the oxide superconducting wire of FIG. 1.
Figure 4:
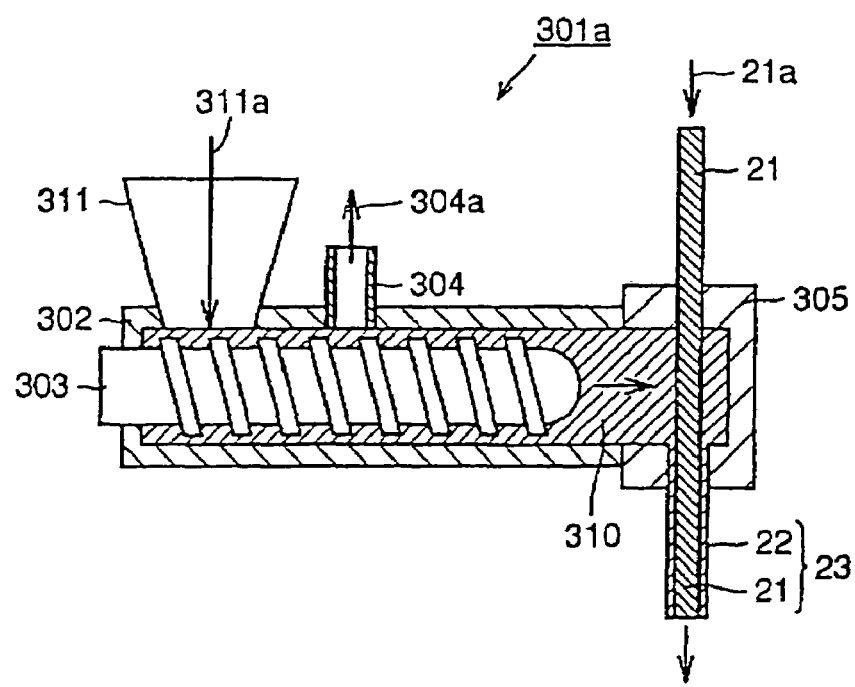
FIG. 4 schematically shows a cross section of the equipment of FIG. 3.

As illustrated in FIGS. 3 and 4, the rod 21 is inserted in an extruder 301a. The extruder 301a is provided with a base body 302, a hopper 311 fitted thereon, an exhaust pipe 304, a crosshead mandrel 305, and a screw 303. The hopper 311 has an upward opening where the precursor powders are fed in a direction indicated with an arrow 311a. The exhaust pipe 304 is arranged to penetrate the base body 302 and release gases to the direction 304a, that are generated as a result of compressing ceramic powders 310. The base body 302 has a hollow structure wherein the screw 303 is installed. The ceramic powder 310 is filled in the base body 302, surrounding the screw 303. When the screw 303 rotates, the ceramic powders 310 move toward the direction shown with an arrow. The screw 303 can be replaced with a plunger.

Figure 5:
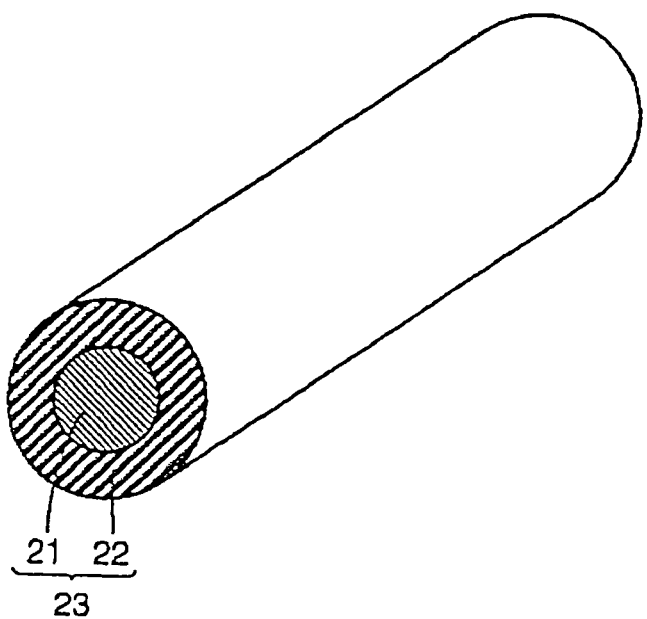
FIG. 5 is a perspective view of a ceramic-coated rod produced at the second stage of manufacturing the oxide superconducting wire of FIG. 1.

The rod 21 is inserted into the crosshead mandrel 305 from the direction indicated with an arrow 21a. At the same time, the screw 303 rotates. The ceramic powders 310 being compressed by the screw 303, are made to move along and cover the rod 21. Taking these steps, ceramic-coated rod 23 as illustrated in FIG. 5 is formed, consisting of the rod 21 and ceramic layer 22.

Figure 6:
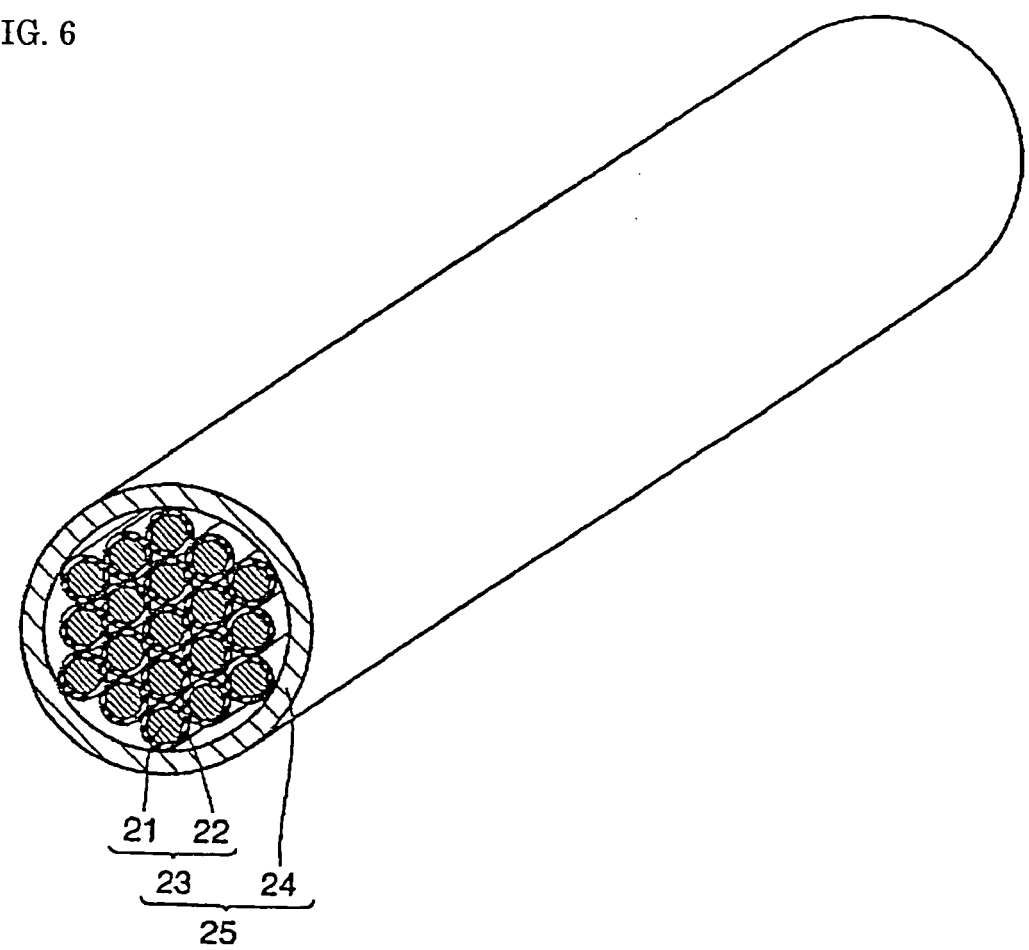
FIG. 6 is a perspective view of a multifilament billet produced at the third stage of manufacturing the oxide superconducting wire of FIG. 1.

FIG. 6 shows a production state in which a plurality of ceramic-coated rods 23 are inserted into a silver sheath 24 so as to produce a multifilament billet 25. The multifilament billet 25 is then subjected to heat treatment to cause thermal decomposition of binders contained in the ceramic layer 22.

Figure 7:
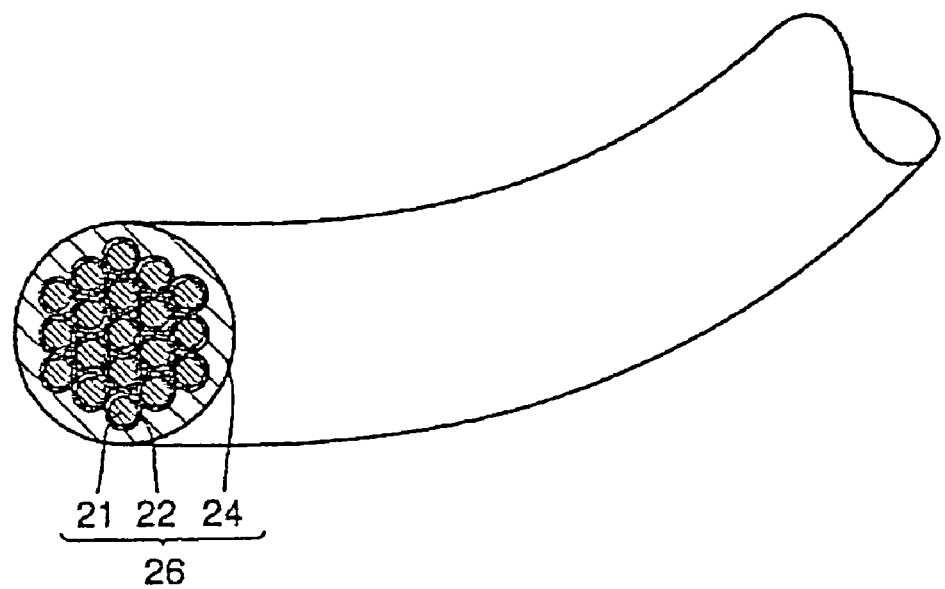
FIG. 7 is a perspective view of a multifilament round wire produced at the fourth stage of of manufacturing the oxide superconducting wire of FIG. 1.

After the thermal decomposition of the binders, the multifilament billet 25 is subjected to plastic deformation for drawing into a multifilament round wire 26 as shown in FIG. 7.

The multifilament round wire 26 shown in FIG. 7 is then formed into a structure having a rectangular cross section and subjected to heat treatment to transform an oxide superconductor in each filament. This produces an oxide superconducting wire 29 having a structure in which a plurality of oxide superconducting filaments 27 are embedded in the ceramic layer 22 that is surrounded by a silver sheath 24 as shown in FIG. 1.

Embodiment 2

Figure 8:
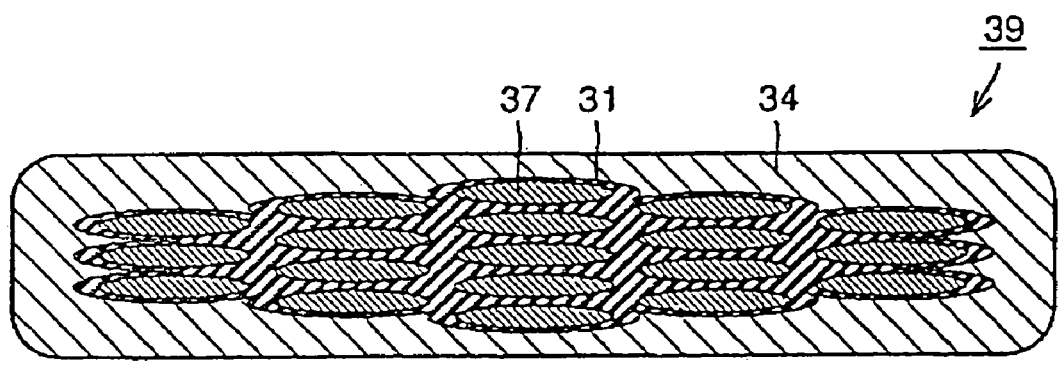
FIG. 8 is a cross-sectional view of an oxide superconducting wire produced according to a second embodiment of the present invention.

FIG. 8 is a cross section of an oxide superconducting wire produced in accordance with the second embodiment of the present invention. The oxide superconducting wire 39 comprises oxide superconducting filaments 37, a ceramic layer 31, and a silver sheath 34 as a metal pipe. The filaments 37 are each in contact and coated with the ceramic layer 31, which become non-conductive when the filaments 37 are cooled to an operating temperature. The ceramic layer 31 is in contact and coated with the silver sheath 34. The oxide superconducting wire 39 is a tape shape extending from the end whose cross section is shown in FIG. 8 toward the other direction not illustrated herein. The filaments 37, the ceramic layer 31 and the silver sheath 34 are formed into tape-shaped structures having a flat cross-section elongated laterally. The filaments 37 consist of, for example, $(Bi, Pb)_2 Sr_2 Ca_2 Cu_3 O_x$. The oxide superconducting wire 39 includes a plurality of the filaments 37 which are each surrounded by the ceramic layer 31. A plurality of the filaments 37 extend spirally around the central axis of the oxide superconducting wire 39.

Figure 9:
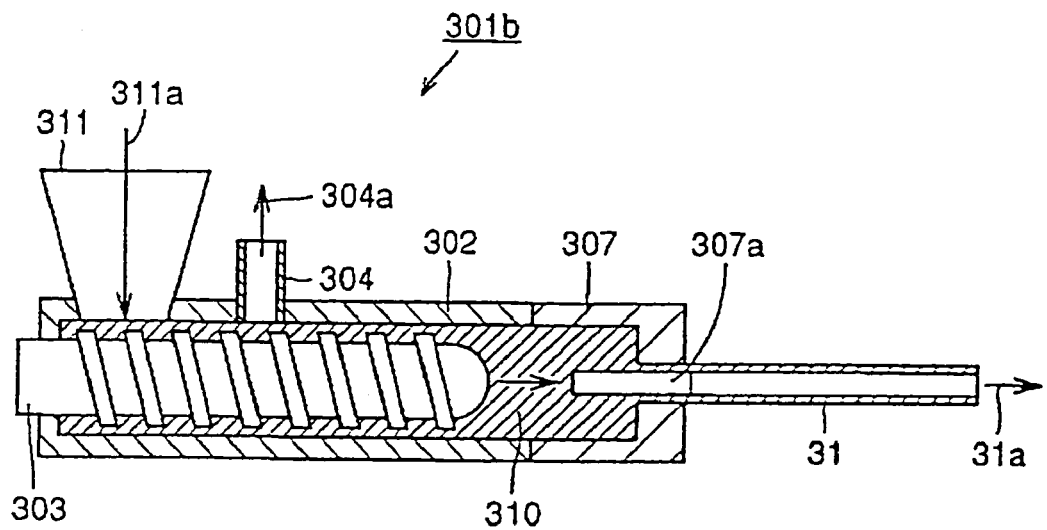
FIG. 9 is a cross-sectional view of an equipment employed at the first stage of producing the oxide superconducting wire of FIG. 8.
Figure 10:
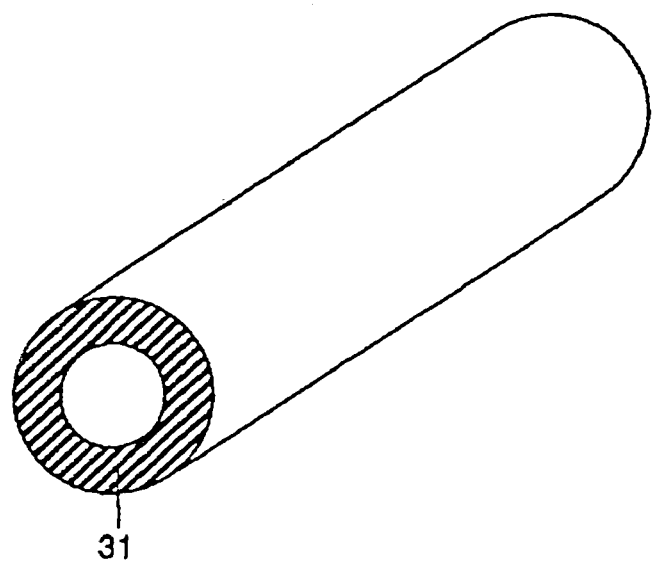
FIG. 10 is a perspective view of a ceramic pipe produced at the first stage of manufacturing the oxide superconducting wire of FIG. 8.

FIGS. 9 to 14 show a process of producing the oxide superconducting wire of FIG. 8. First, an extruder 301b is prepared as shown in FIG. 9. Similar to the extruder 301a of FIGS. 3 and 4, the extruder 301b is also provided with a hopper 311, a base body 302, an exhaust pipe 304, and a screw 303. A mandrel 307 is installed on one end of the base body 302, which contains a cylindrical rod 307a in its central part. The base body 302 is filled with ceramic powders 310. The rotating screw 303 allows the ceramic powders 310 to be extruded from the mandrel 307, and then a pipe-shaped ceramic layers 31 is formed extending toward the direction indicated with an arrow 31a in FIG. 10.

Figure 11:
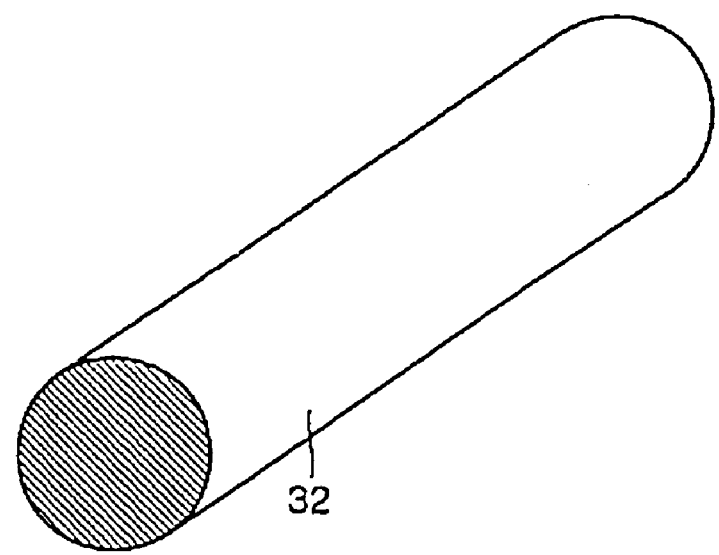
FIG. 11 is a perspective view of a rod produced at the second stage of manufacturing the oxide superconducting wire of FIG. 8.

According to the same method as Embodiment 1, a rod 32 shown in FIG. 11 is formed from a precursor powder to be transformed to an oxide superconducting filament.

Figure 12:
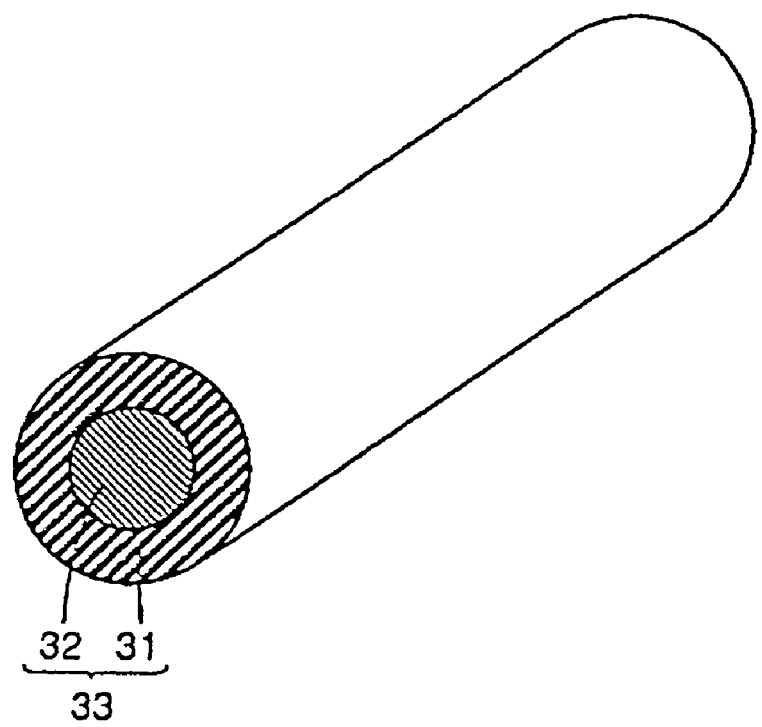
FIG. 12 is a perspective view of a ceramic-coated rod produced at the third stage of manufacturing the oxide superconducting wire of FIG. 8.

FIG. 12 shows a ceramic-coated rod 33 having a structure in which the rod 32 is inserted into the pipe-shaped ceramic layer 31.

Figure 13:
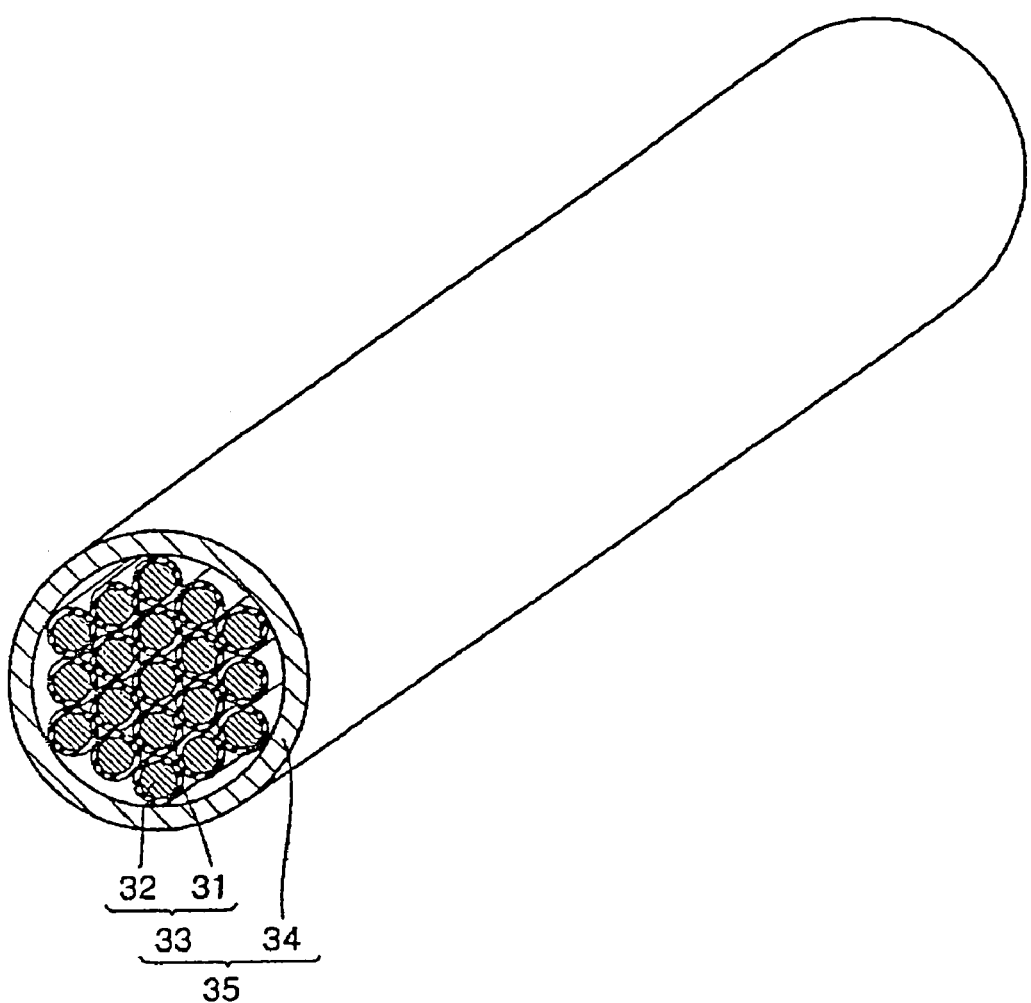
FIG. 13 is a perspective view of a multifilament billet produced at the fourth stage of manufacturing the oxide superconducting wire of FIG. 8.

As shown in FIG. 13, a plurality of the ceramic-coated rods 33 are made into a bundle, which is then inserted into a silver-based sheath 34 to form a multifilament billet 35. The multifilament billet 35 is subjected to heat treatment to cause thermal decomposition of binders contained in the ceramic layers 31.

Figure 14:
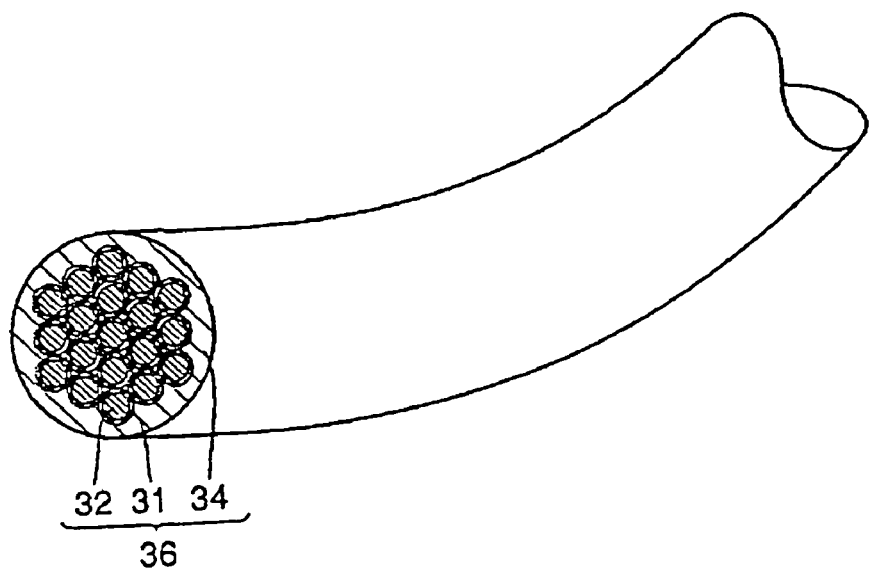
FIG. 14 is a perspective view of a multifilament round wire produced at a fifth stage of manufacturing the oxide superconducting wire of FIG. 8.

FIG. 14 illustrates a multifilament round wire 36 formed by drawing the multifilament billet 35 after the thermal decomposition of the binders.

The multifilament round wire 36 illustrated in FIG. 14 is formed into a shape having a rectangular cross section, and is subjected to a heat treatment so as to convert each filament into an oxide superconductor. This produces an oxide superconducting wire 39 having a structure shown in FIG. 8 in which a plurality of the filaments consisting of oxide superconductors are embedded in the ceramic layer 31 that is encased in the silver sheath 34.

Embodiment 3

Figure 15:
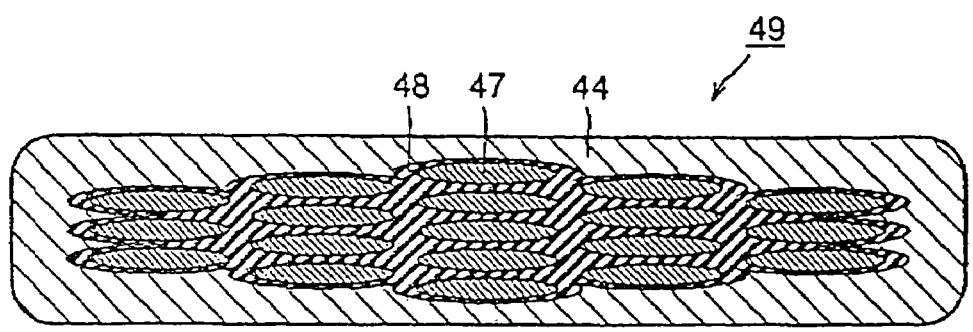
FIG. 15 is a cross-sectional view of an oxide superconducting wire produced according to a third embodiment of the present invention.

FIG. 15 is a cross section of an oxide superconducting wire produced in accordance with the third embodiment of the present invention. The oxide superconducting wire 49 comprises oxide superconducting filaments 47, a ceramic layer 48, and a silver sheath 44 as a metal pipe. The filaments 47 are each in contact and coated with the ceramic layer 48, which become non-conductive when the filaments 47 are cooled to an operating temperature. The ceramic layer 48 is in contact and coated with the silver sheath 44. The oxide superconducting wire 49 is a tape shape extending from the end whose cross section is shown in FIG. 15 toward the other direction not illustrated herein. The filaments 47, the ceramic layer 48 and the silver sheath 44 are formed into tape-shaped structures having a flat cross-section elongated laterally. The filaments 47 consist of, for example, $(Bi, Pb)_2 Sr_2 Ca_2 Cu_3 O_x$. The oxide superconducting wire 49 includes a plurality of the filaments 47 which are each surrounded by the ceramic layer 48. These filaments 47 are formed into a shape spirally extending around the central axis of the oxide superconducting wire 49.

Figure 16:
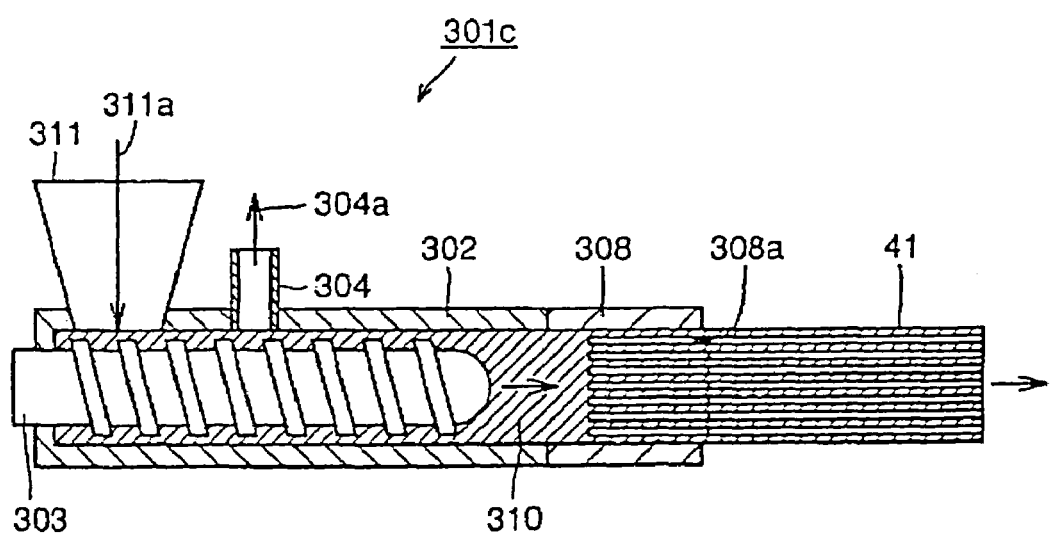
FIG. 16 is a cross-sectional view of an equipment employed at the first stage of producing the oxide superconducting wire of FIG. 15.
Figure 17:
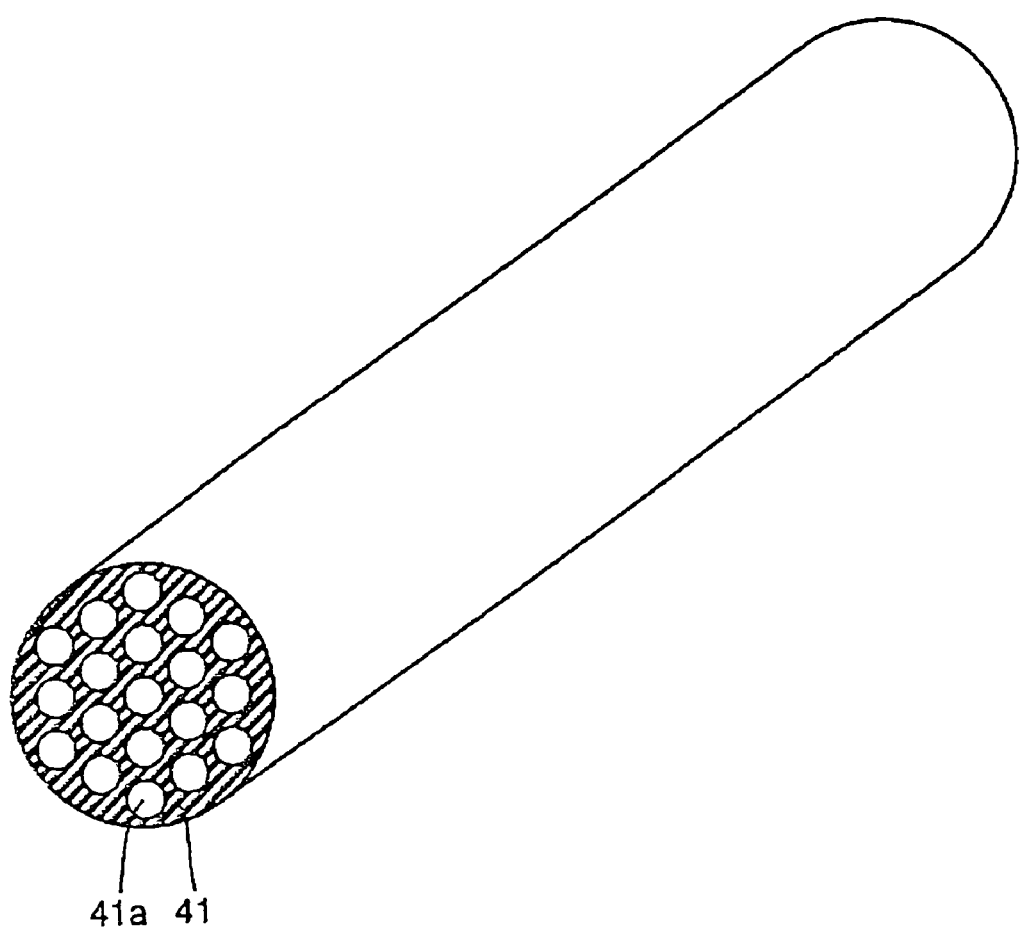
FIG. 17 is a perspective view of a ceramic billet produced at the first stage of manufacturing the oxide superconducting wire of FIG. 15.

FIGS. 16 through 20 illustrate a method of producing the oxide superconducting wire of FIG. 15 by Embodiment 3 of the present invention. First, an extruder 301c is prepared as shown in FIG. 16. Similar to the other extruder employed in Embodiment 1, this extruder 301c is provided with a base body 302, a hopper 311, an exhaust pipe 304, and a screw 303. A mandrel 308 installed on one end of the base body 302 contains a plurality of cylindrical rods 308a. The rotating screw 303 allows ceramic powders 310 to be extruded through the mandrel 308 and form into a honeycomb-structured ceramic billet 41. The honeycomb-structured ceramic billet 41 contains a plurality of holes as indicated in FIG. 17. The holes 41a extend in the same direction as does the ceramic billet 41.

Figure 18:
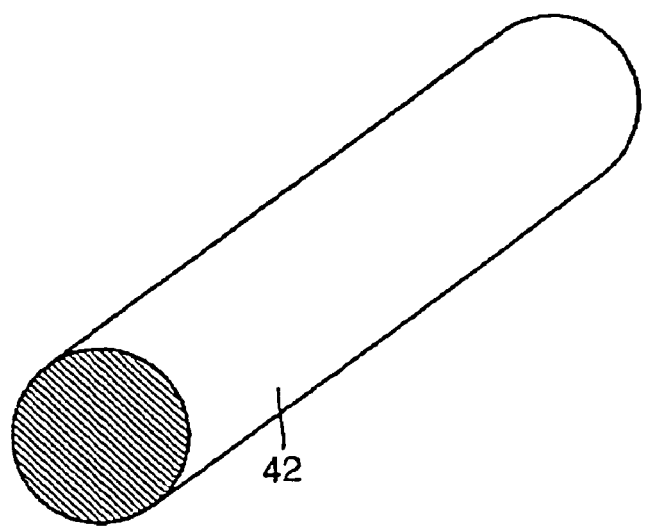
FIG. 18 is a perspective view of a rod produced at the second stage of manufacturing the oxide superconducting wire of FIG. 15.

Secondly, a rod 42 shown in FIG. 18 is formed from precursor powders to be transformed to an oxide superconducting filament, following the same method employed in Embodiment 1.

Figure 19:
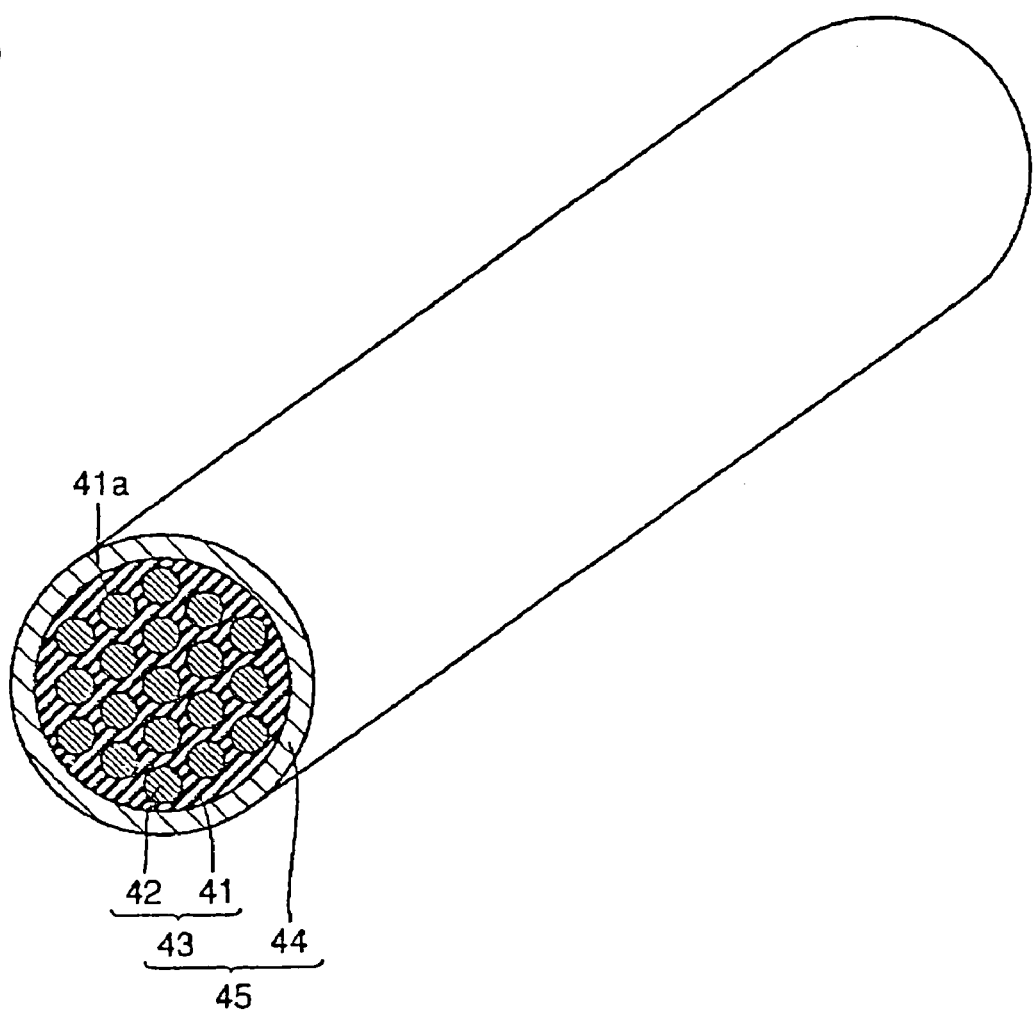
FIG. 19 is a perspective view of a multifilament billet produced at the third and fourth stage of manufacturing the oxide superconducting wire of FIG. 15.

As illustrated in FIG. 19, a plurality of the rods 42 are inserted into the holes 41a to produce ceramic-coated rods 43. The ceramic-coated rods 43 are inserted into the silver-based sheath 44 functioning as a metal pipe to produce a multifilament billet 45. The multifilament billet 45 is subjected to heat treatment to cause the thermal decomposition of binders contained in the ceramic billet 41.

Figure 20:
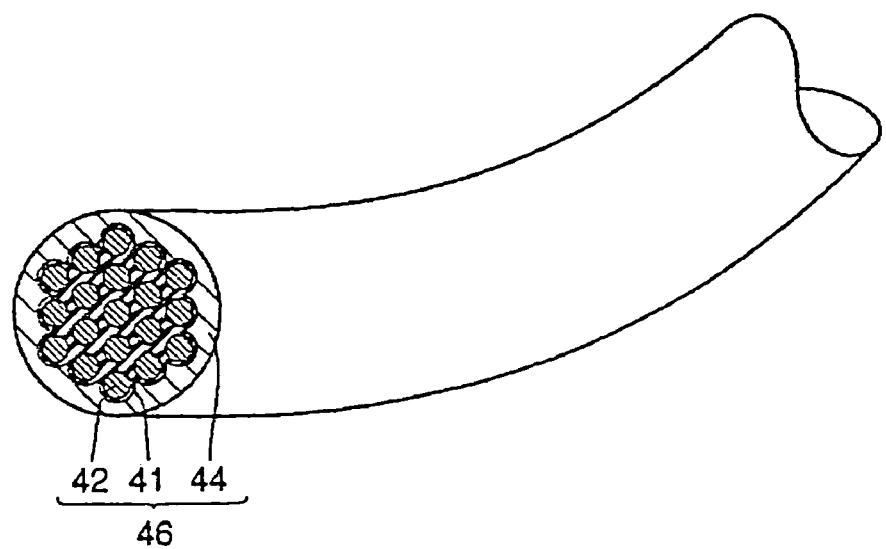
FIG. 20 is a perspective view of a multifilament round wire produced at the fifth stage of manufacturing the oxide superconducting wire of FIG. 15.

As shown in FIG. 20, the multifilament billet 45 is drawn into a multifilament round wire 46 with plastic deformation, after the thermal decomposition of the binders takes place.

The multifilament round wire 46 indicated in FIG. 20 is formed into a shape having a rectangular cross section and then subjected to heat treatment to transform oxide superconductors inside the filaments. As a result, the oxide superconducting wire 49, in which a plurality of oxide superconducting filaments 47 shown in FIG. 15 are embedded in the ceramic layer 48 encased in a silver sheath, is produced.

Embodiment 4

Figure 21:
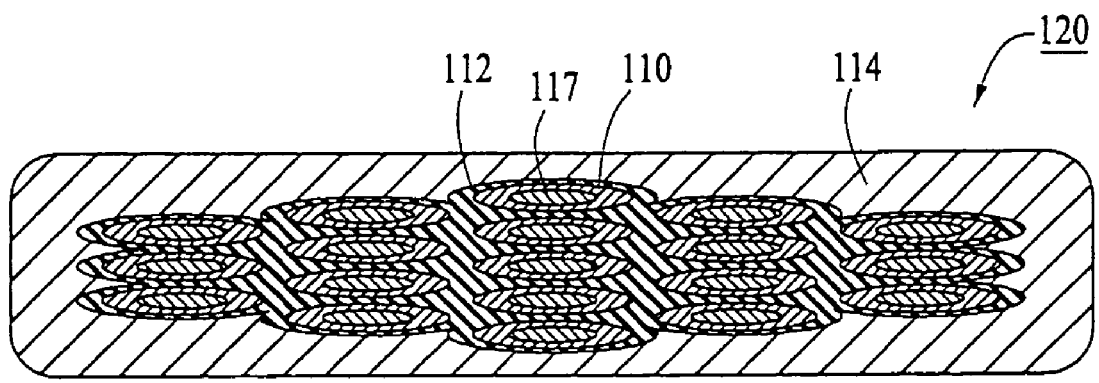
FIG. 21 is a cross-sectional view of an oxide superconducting wire produced according to a fourth embodiment of the present invention.

FIG. 21 is a cross section of an oxide superconducting wire produced in accordance with the fourth embodiment of the present invention. The oxide superconducting wire 120 comprises oxide superconducting filaments 117, silver sheaths 110, a ceramic layer 112, and a silver sheath 114 as a metal pipe. The filaments 117 are coated with the ceramic layer 112 produced through an extrusion process. The ceramic layer 112 becomes non-conductive at the operating temperature of the filament 117. The ceramic layer 112 is directly covered with the silver sheath 114. The silver sheaths 110 are each interposed between the respective filaments 117 and the ceramic layer 112. The oxide superconducting wire 120 is formed into a tape shape, extending from one end whose cross section is shown in FIG. 21 to the other end not illustrated herein. The filaments 117, the silver sheaths 110, the ceramic layer 112, and the silver sheath 114 are formed into flat and tape-shaped structures, extending laterally. The filaments 117 consist of, for example, $(Bi, Pb)_2$ $Sr_2 Ca_2 Cu_3 O_x$. The oxide superconducting wire 120 comprises a plurality of the filaments 117 each enclosed by the respective silver sheaths 110, which are in turn circumferentially coated with the ceramic layer 112. A plurality of the filaments 117 extend spirally around the central axis of the oxide superconducting wire 120.

Figure 22:
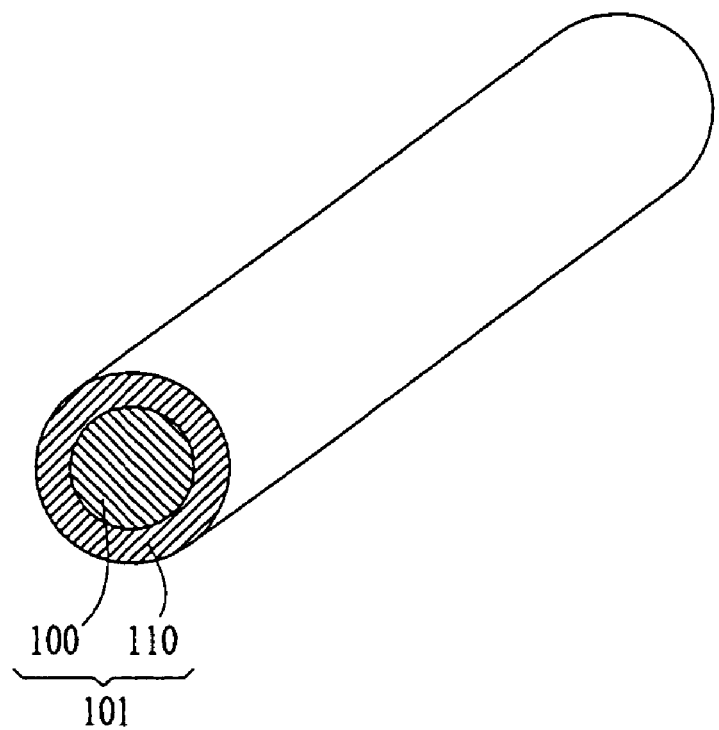
FIG. 22 is a perspective view of a silver-coated rod produced at the second stage of manufacturing the oxide superconducting wire of FIG. 21.

FIGS. 22 to 25 illustrate a method of producing the oxide superconducting wire of FIG. 21. First, a rod 100 is formed from precursor powders of oxide superconducting filaments. The rod 100 is inserted into a silver sheath 110 to create a silver-coated rod 101 as illustrated in FIG. 22.

Figure 23:
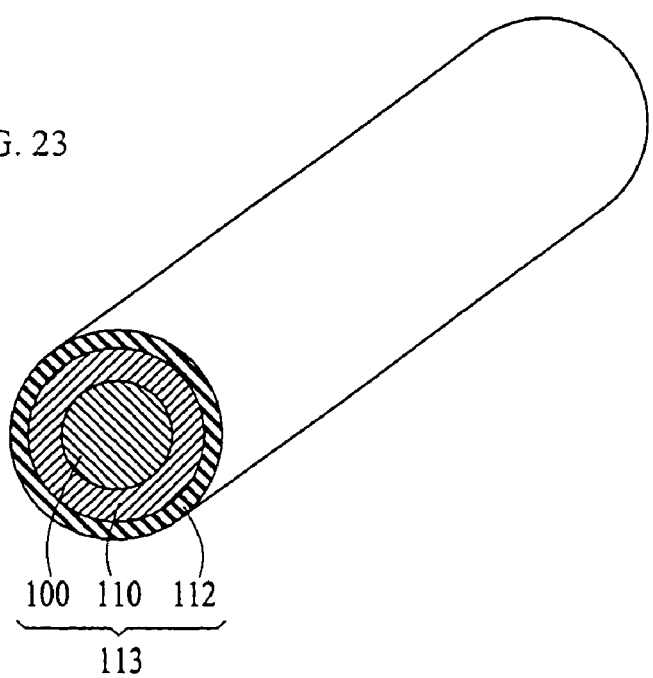
FIG. 23 is a perspective view of a ceramic/silver-coated rod produced at the third stage of manufacturing the oxide superconducting wire of FIG. 21.

As illustrated in FIG. 23, the ceramic layer 112 is formed on the silver sheath 110 through an extrusion process as in Embodiment 1 to produce a ceramic/silver-coated rod 113.

Figure 24:
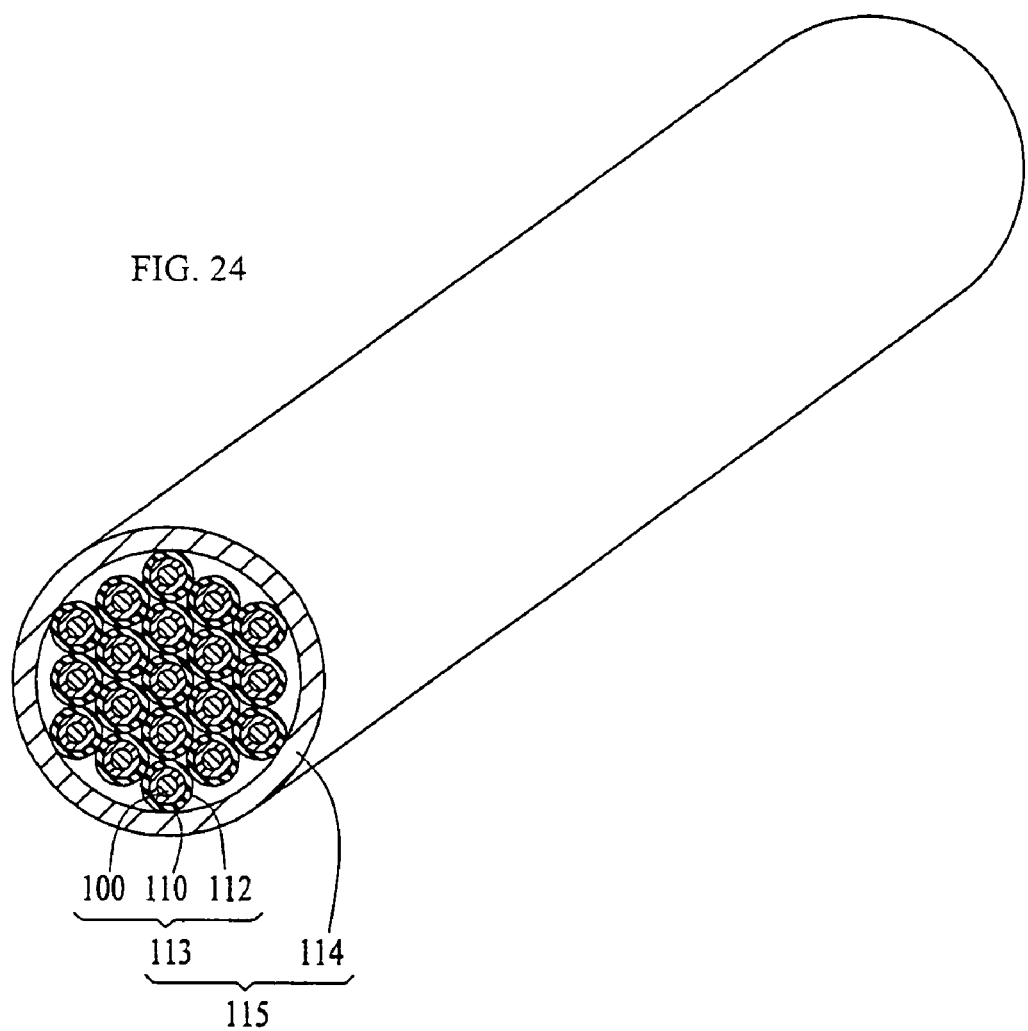
FIG. 24 is a perspective view of a multifilament billet produced at the fourth stage of the manufacturing the oxide superconducting wire of FIG. 21.

As illustrated by FIG. 24, the ceramic/silver-coated rods 113 are inserted in a silver sheath 114 to create a multifilament billet 115. The multifilament billet 115 is subjected to heat treatment to cause thermal decomposition of binders contained in the ceramic.

Figure 25:
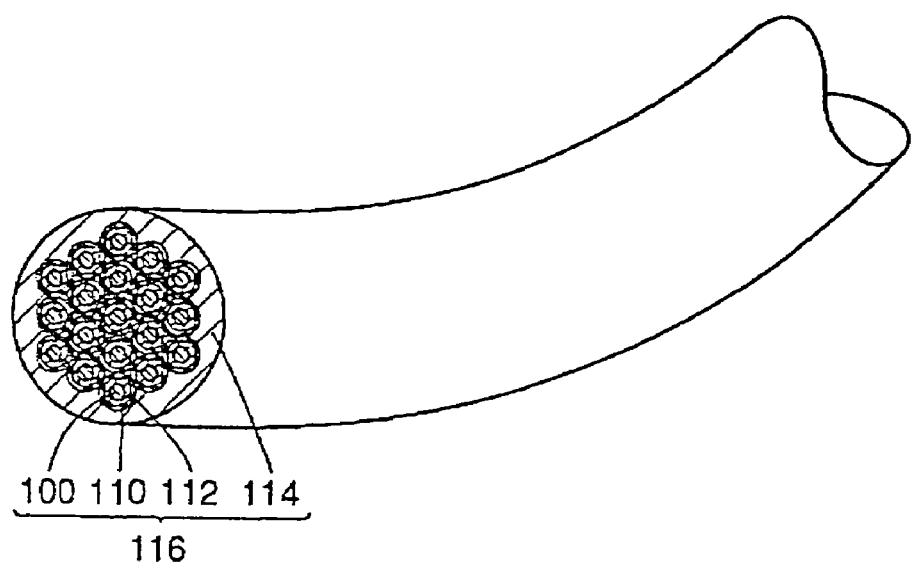
FIG. 25 is a perspective view of a multifilament round wire produced at the fifth stage of manufacturing the oxide superconducting wire of FIG. 21.

As indicated in FIG. 25, the multifilament billet 115, after thermal decomposition, is drawn into a multifilament round wire 116 with plastic deromation.

The oxide superconducting wire 120, in which a plurality of oxide superconducting filaments 117 are embedded in the ceramic layer 112 enveloped by the silver sheath 114 as shown in FIG. 21, is produced by forming the multifilament round wire 116 of FIG. 25 into a shape having a rectangular cross section and then subjecting it to a heat treatment to convert the filaments into oxide superconductors.

EXAMPLES

Described below are conventional techniques for producing an oxide superconducting wire.

Comparative Embodiment 1

Figure 26:
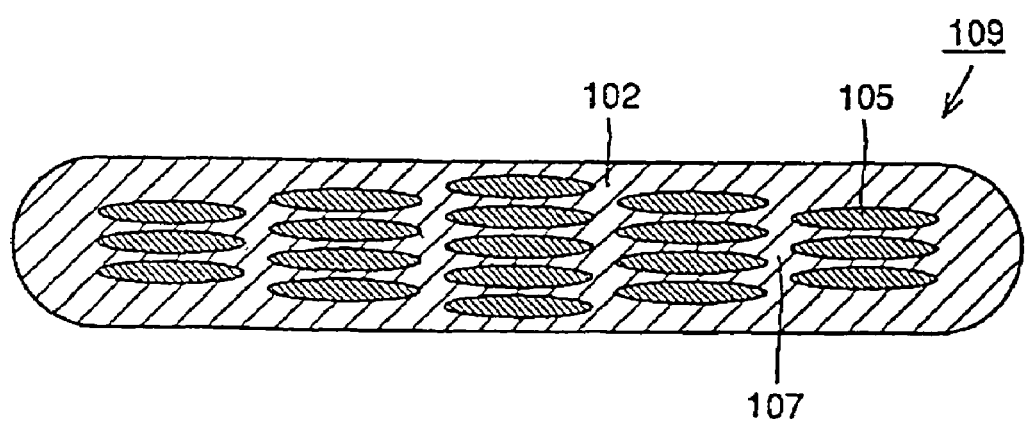
FIG. 26 is a cross-sectional view of an oxide superconducting wire produced according to the comparative embodiment 1.

FIG. 26 is a cross section of an oxide superconducting wire produced in accordance with the first comparative embodiment. The oxide superconducting wire 109 comprises oxide superconducting filaments 105, a silver matrix 107, and a silver sheath 102. The oxide superconducting filaments 105 are surrounded by the silver matrix 107, which is in turn encased in the silver-based sheath 102. A plurality of the filaments 105 are formed such that they extend spirally in the direction that the oxide superconducting wire 109 extends.

Figure 27:
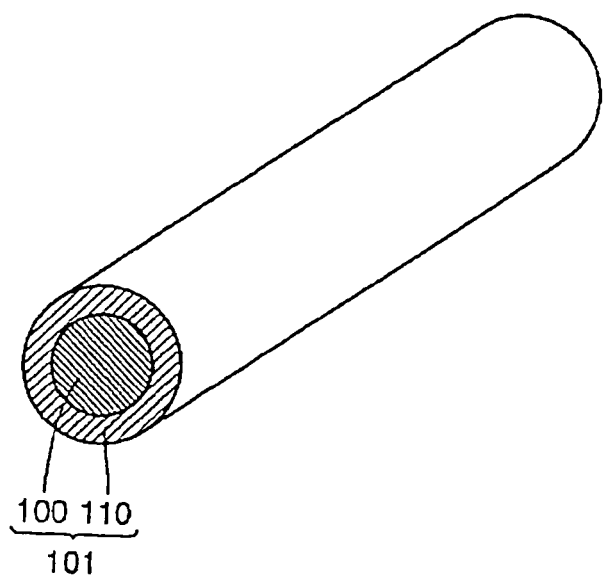
FIG. 27 is a perspective view of a silver-coated rod produced at the first stage of manufacturing the oxide superconducting wire of FIG. 26.
Figure 28:
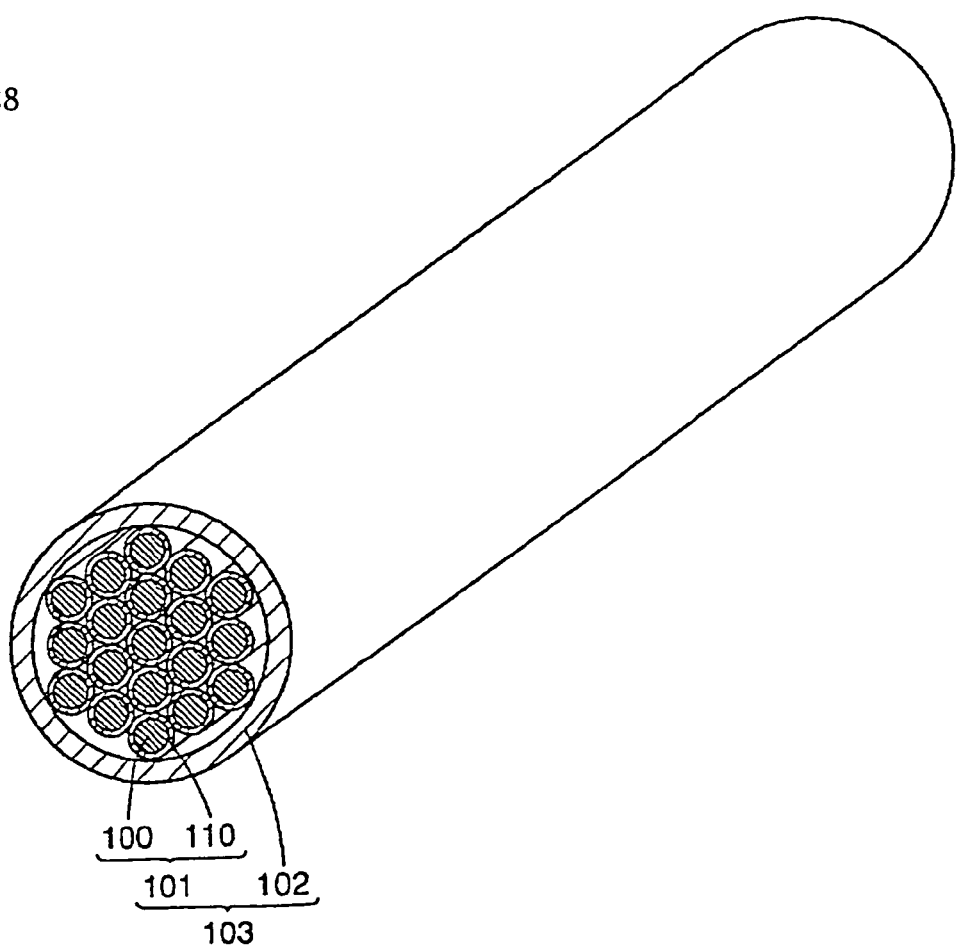
FIG. 28 is a perspective view of a multifilament billet produced at the second stage of manufacturing the oxide superconducting wire of FIG. 26.
Figure 29:
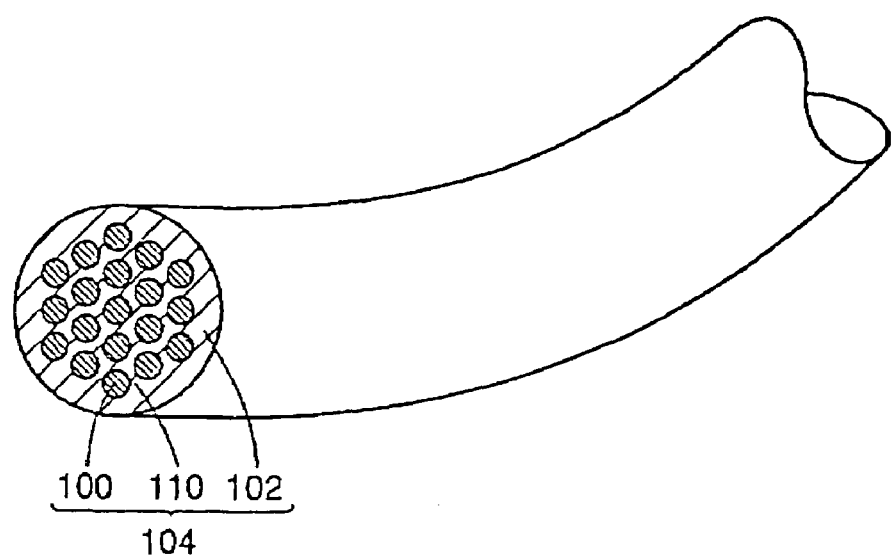
FIG. 29 is a perspective view of a multifilament round wire produced at the third stage of manufacturing the oxide superconducting wire of FIG. 26.

FIGS. 27 to 29 illustrate a method of producing the oxide superconducting wire of FIG. 26. As illustrated in FIG. 27, precursor powders for oxide superconducting filaments are formed into a rod 100. The rod 100 is enclosed by a silver-based sheath 110 and then drawn into a silver-alloy coated rod 101.

As illustrated in FIG. 28, the silver-alloy coated rods 101 are inserted in a silver sheath 102 to form a multifilament billet 103.

As shown in FIG. 29, a multifilament round wire 104 is obtained by drawing the multifilament billet 103 with plastic deformation.

The multifilament round wire 104 of FIG. 29 is formed into a shape having a rectangular cross section and subjected to heat treatment to transform oxide superconductors in the filaments. As a result, the oxide superconducting wire 109 illustrated in FIG. 26, in which a plurality of the oxide superconducting filaments 105 are surrounded by the silver matrix 107 and further circumferentially coated with the silver sheath 102, is produced.

Comparative Embodiment 2

Figure 30:
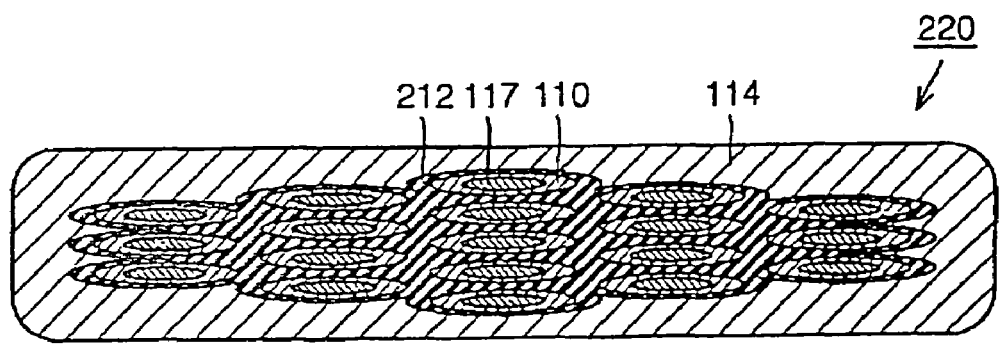
FIG. 30 is a cross-sectional view of an oxide superconducting wire produced according to the comparative embodiment 2.
Figure 31:
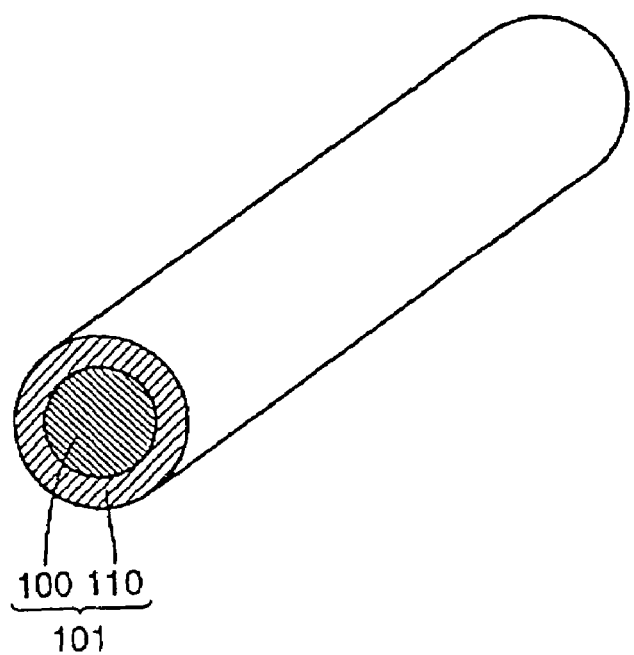
FIG. 31 is a perspective view of a silver-coated rod produced at the first stage of manufacturing the oxide superconducting wire of FIG. 30.

FIG. 30 is a cross section of an oxide superconducting wire manufactured in accordance with the second comparative embodiment. The oxide superconducting wire 220 produced in the second comparative embodiment differs from Embodiment 4 in the step of producing ceramic layer 212. While the ceramic layer 112 is formed by an extrusion method in Embodiment 4, the ceramic layer 212 is produced by a painting method in the second comparative embodiment.

FIGS. 31 to 34 illustrate a method of producing the oxide superconducting wire 220 of FIG. 30. First, precursor powders for oxide superconducting filaments are formed into a rod 100. The rod 100 is inserted in a silver sheath 110 to create a silver-coated rod 101.

Figure 32:
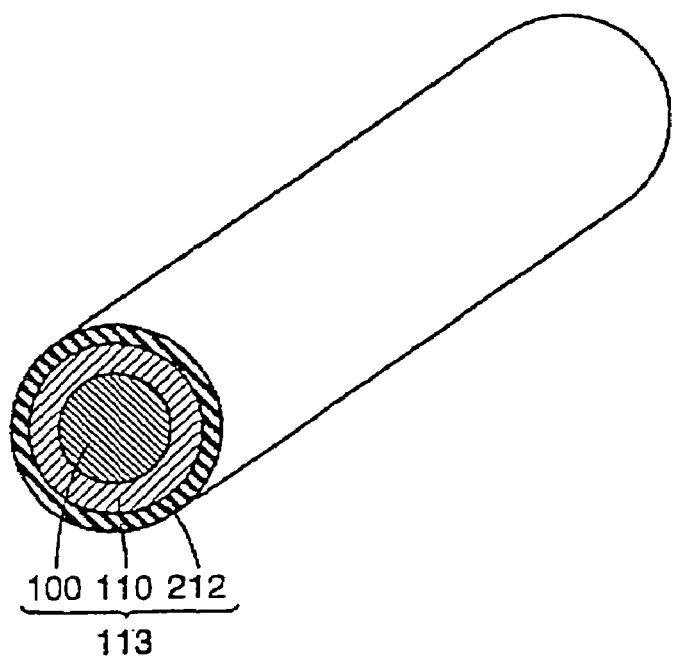
FIG. 32 is a perspective view of a ceramic/silver-coated rod produced at the second stage of manufacturing the oxide superconducting wire of FIG. 30.

A mixture of ceramics and binders is painted to the surface of the silver sheath 110 to form the ceramic layer 212 thereon, whereby a ceramic/silver-coated rod 113 of FIG. 32 is produced. The volumetric ratio of the binder contained in the mixture is specified as 50%.

Figure 33:
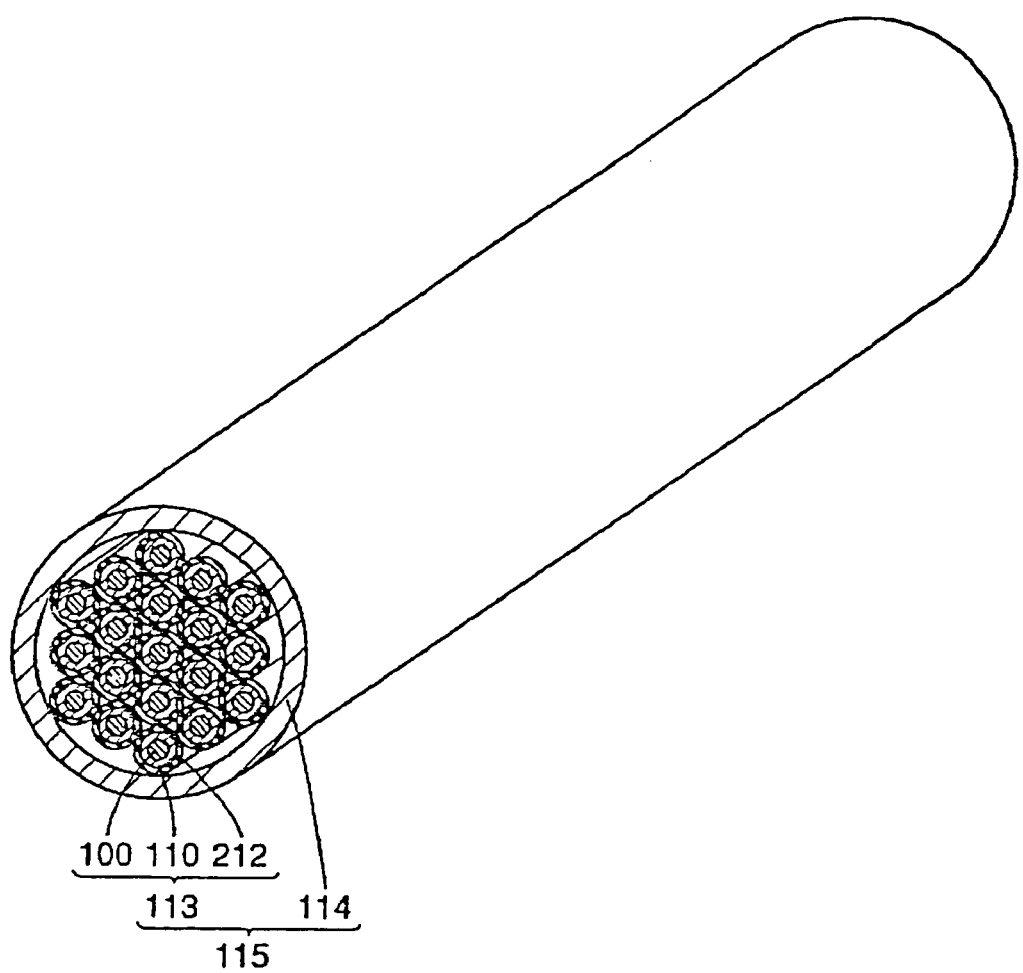
FIG. 33 is a perspective view of a multifilament billet produced at the third stage of manufacturing the oxide superconducting wire of FIG. 30.

As indicated in FIG. 33, a plurality of the ceramic/silver-coated rods 113 are bundled together and inserted in a silver-based sheath 114 to produce a multifilament billet 115. The multifilament billet 115 is subjected to heat treatment to cause thermal decomposition of the binders contained in the ceramic layers 212.

Figure 34:
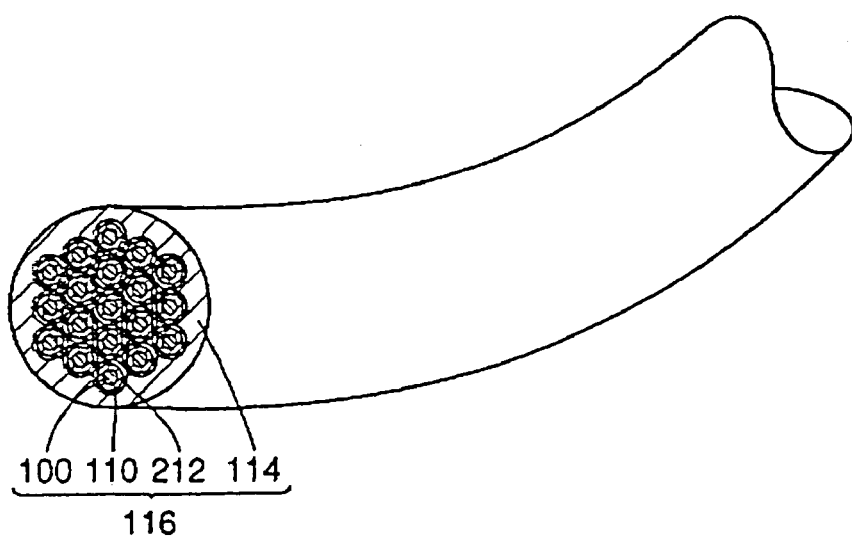
FIG. 34 is a perspective view of a multifilament round wire produced at the fourth stage of manufacturing the oxide superconducting wire of FIG. 30.

As illustrated in FIG. 34, the multifilament billet 115, where thermal decomposition of the binders has completed, is then drawn into a multifilament round wire 116 with plastic deformation.

The multifilament round wire 116 of FIG. 34 is formed into a wire having a rectangular cross section and subjected to heat treatment to transform oxide superconductors in the filaments. This produces the oxide superconducting wire 220 in which a plurality of the oxide superconducting filaments 117 are each encased in the silver sheath 110, and further circumferentially coated with the ceramic layer 212 that is enclosed by the silver sheath 114.

Preparation (1) Samples A to F

First, samples were prepared as shown in the Table.

TABLE

| Samples | Embodiments | Filaments | Layers | Sheaths | Ic (77K, OT) | Twist pitch | Normalized AC loss |
|---|---|---|---|---|---|---|---|
| A | Comparative Embodiment 1 | Precursor → (Bi, Pb) based 2223 | Silver | Silver-based | 50A | 15 mm | 1 |
| B | Comparative Embodiment 2 | | Silver/ (Ca, Sr)—Cu—O | Silver | 44A | | 0.86 |
| C | Embodiment 4 | | | Silver-based | 48A | | 0.53 |
| D | Embodiment 1 | | (Ca, Sr)—Cu—O | | 43A | | 0.45 |
| E | Embodiment 2 | | | | 51A | | 0.55 |

TABLE-continued

| Samples | Embodiments | Filaments | Layers | Sheaths | Ic (77K, OT) | Twist pitch | Normalized AC loss |
|---|---|---|---|---|---|---|---|
| F | Embodiment 3 | | | | 43A | | 0.43 |
| G | Embodiment 1 | (Bi, Pb) based 2212 powders → (Bi, Pb) based 2223 | | | 92A | | 0.47 |

As for the preparation of Samples A to F, the oxides or carbonates of Bi, Pb, Sr, Ca, and Cu were mixed according to the composition ratio of $(Bi, Pb)_2 Sr_2 Ca_2 Cu_3O_x$ superconductors and were repeatedly subjected to heat treatment and pulverization to produce preliminarily sintered powders as their precursors. The superconducting wires were manufactured from the precursors according to the methods of Embodiments 1 to 4 and Comparative Embodiments 1 to 2. In the individual production methods, the wires were twisted prior to the last stage of plastic deformation, that is, before the wires were formed into a structure having a rectangular cross section. The oxide superconducting wires were composed of 61 filaments, and formed to a tape-like shape of 3.5 mm width and 0.23 mm thickness.

(2) Sample G

As for Sample G, the oxides or carbonates of Bi, Pb, Sr, Ca, and Cu were mixed according to the composition ratio of $(Bi, Pb)_2 Sr_2 Ca_2 Cu_3O_x$ superconductors, and were repeatedly subjected to heat treatment and pulverization to produce a powder of the precursor. Ceramic layers employed in Sample G were formed specifically from a (Ca, Sr)—Cu oxide. The precursor and the ceramic layers were used to produce an oxide superconducting wire with the method specified in Embodiment 1. Similar to the aforementioned cases of Samples A to F, the wire produced from Sample G was twisted. The oxide superconducting wire thus obtained was required to contain 61 filaments and have a shape of a tape whose width and thickness were specified respectively as 3.5 mm and 0.23 mm. During the heat treatment conducted on the wire to form said wire into a final shape, a (Ca, Sr)—Cu oxide matrix and the precursor react with each other to produce $(Bi, Pb)_2 Sr_2 Ca_2 Cu_3O_x$ superconductors.

Results

The individual critical current (Ic) of Samples A to G was measured in liquid nitrogen whose temperature was set at 77 K. The individual AC loss of Samples A to G was also measured in liquid nitrogen of 77 K by the magnetization method, wherein an external magnetic field (the magnetic field: 0.1T, frequency: 50 Hertz) was applied individually on the wires in a direction perpendicular to the longitudinal direction thereof and parallel to the flat surfaces thereof. The AC loss of each sample was estimated according to the following formula based on the length and critical current of the respective wire.

$Wi$=(AC loss of Sample $i$)/[critical current value of Sample $i$ length of Sample $i$]

The unit of Wi is W/A·m.

The AC loss values thus calculated for the respective samples were divided by the AC loss value of Sample A according to the following formula, and the values thus obtained were defined as the normalized AC losses.

Normalized AC loss $<Wi>=Wi/WA$

Results of the normalized AC loss are indicated in the Table.

As can be seen from the Table, Samples A and B of the comparative embodiments exhibited relatively large AC losses, while the AC losses of Samples C to G of the present invention were extremely small. This proves that an oxide superconducting wire having a relatively low AC loss can be produced according to the present invention.

Aside from the representative implementations herein described, other varied embodiments are also conceivable with regard to the present invention. For example, not only a Bi2223-based oxide superconductor but also a Bi2212-based oxide superconductor can be used.

Preferably, ceramic powders for enclosing such superconductors include bismuth, lead, strontium, calcium and copper. Most preferably, the ceramic powders contain oxidized calcium, strontium and copper.

The embodiments herein disclosed are for the purpose of examples in all aspects and should not be considered as excluding other embodiments. The scope of the present invention should be defined by the scope of claims, instead of the foregoing description, and should include any changes made within the scope of equivalency thereof.

What is claimed is:

1. A method of producing an oxide superconducting wire, said method comprising the steps of:
   forming a precursor of oxide superconductor into a rod;
   forming a ceramic layer on the surface of said rod to produce a ceramic-coated rod;
   inserting a plurality of said ceramic-coated rods into a metal pipe to produce a multifilament billet;
   subjecting said multifilament billet to plastic deformation to form a multifilament wire, having the ceramic layer on each ceramic-coated rod in contact with the ceramic layer on at least one other ceramic-coated rod;
   subjecting said multifilament wire to a heat treatment to produce oxide superconductors.

2. A method of producing an oxide superconducting wire, said method comprising the steps of:
   forming a precursor of oxide superconductor in silver-based sheath to produce a coated rod;
   forming a ceramic layer on the surface of said coated rod by extrusion to produce a ceramic-coated rod;
   inserting a plurality of said ceramic-coated rods into a metal pipe to produce a multifilament billet;
   subjecting said multifilament billet to plastic deformation to produce a multifilament wire, having the ceramic layer on each ceramic-coated rod in contact with the ceramic layer on at least one other ceramic-coated rod;
   subjecting said multifilament wire to a heat treatment to produce oxide superconductors.

3. A method of producing an oxide superconducting wire as defined in claim 1, wherein said ceramic layer contains a part of the composition elements of said oxide superconductors.

4. A method of producing an oxide superconducting wire as defined in claim 1, said method further comprising a step of twisting said multifilament wire prior to said heat treatment.

5. A method of producing an oxide superconducting wire as defined in claim 1, wherein said ceramic layer contains an oxide of at least one kind selected from the group consisting of bismuth, lead, strontium, calcium, barium, titanium, niobium, molybdenum, tantalum, tungsten, vanadium, zirconium, copper and silver.

6. A method of producing an oxide superconducting wire as defined in claim 1, wherein said oxide superconductors are bismuth-based superconductors.

7. A method of producing an oxide superconducting wire as defined in claim 5, wherein said ceramic layer contains an oxide including an alkali earth metal and copper.

8. A method of producing an oxide superconducting wire as defined in one of claim 1, wherein said metal pipe contains at least one kind selected from the group consisting of silver, copper, manganese, magnesium, antimony, iron, chromium, and nickel.

9. A method of producing an oxide superconducting wire as defined in claim 1, wherein said ceramic layer formed by an extrusion process.

10. A method of producing an oxide superconducting wire as defined in claim 2, said method further comprising a step of twisting said multifilament wire prior to said heat treatment.

11. A method of producing an oxide superconducting wire as defined in claim 2, wherein said ceramic layer contains an oxide of at least one kind selected from the group consisting of bismuth, lead, strontium, calcium, barium, titanium.

12. A method of producing an oxide superconducting wire as defined in claim 2, wherein said oxide superconductors are bismuth-based superconductors.

13. A method of producing an oxide superconducting wire as defined in claim 2, wherein said metal pipe contains at least one kind selected from the group consisting of silver, copper, manganese, magnesium, antimony, iron, chromium, and nickel.

14. A method of producing an oxide superconducting wire as defined in claim 1, wherein the step of inserting the plurality of the ceramic-coated rods into the metal pipe further comprises the step of inserting the plurality of the ceramic-coated rods adjacent to each other into the metal pipe with no metal between the adjacent ceramic-coated rods.

15. A method of producing an oxide superconducting wire as defined in claim 2, wherein the step of inserting the plurality of the ceramic-coated rods into the metal pipe further comprises the step of inserting the plurality of the ceramic-coated rods adjacent to each other into the metal pipe with no metal between the adjacent ceramic-coated rods.

16. A multifilament oxide superconducting wire formed from a multifilament billet, said multifilament billet comprising:
a plurality of oxide superconductor precursor rods;
a ceramic layer coated on the surface of each of the plurality of oxide superconductor precursor rods;
a metal pipe encasing the plurality of oxide superconductor precursor rods each coated with the ceramic layer;
wherein:
the multifilament billet is subject to plastic deformation and a heat treatment to form the multifiliment oxide superconducting wire, and
the ceramic layer on each road is in contact with the ceramic layer on at least one other rod.

17. The multifilament oxide superconducting wire of claim 16, wherein each of the plurality of oxide superconductor precursor rods comprises a silver-based sheath, and wherein the ceramic layer is coated onto each of the oxide superconductor precursor rods with the silver-based sheath through extrusion.

18. The multifilament oxide superconducting wire of claim 16, wherein the rods are in a spaced relationship relative to each other and with no metal between the spaced rods.

19. The multifilament oxide superconducting wire of claim 17, wherein the rods are in a spaced relationship relative to each other and with ceramic between the spaced rods.

* * * * *

UNITED STATES PATENT AND TRADEMARK OFFICE
CERTIFICATE OF CORRECTION

PATENT NO. : 7,162,287 B2
APPLICATION NO. : 10/749574
DATED : January 9, 2007
INVENTOR(S) : Naoki Ayai It is certified that error appears in the above-identified patent and that said Letters Patent is hereby corrected as shown below:

Col. 18, Line 23
Claim 16 (line 11): "multifiliment" should be --multifilament--.

Signed and Sealed this

Eighth Day of May, 2007

JON W. DUDAS
*Director of the United States Patent and Trademark Office*